US010566216B2

(12) United States Patent
Senn et al.

(10) Patent No.: US 10,566,216 B2
(45) Date of Patent: Feb. 18, 2020

(54) EQUIPMENT FRONT END MODULE GAS RECIRCULATION

(71) Applicant: Lam Research Corporation, Fremont, CA (US)

(72) Inventors: Brandon Lee Senn, Molalla, OR (US); Peter R. Wassei, Newberg, OR (US); Scott Vernon Wong, Mountain View, CA (US); Silvia Rocio Aguilar Amaya, San Jose, CA (US); Todd Anthony Lopes, Livermore, CA (US); Richard Howard Gould, Fremont, CA (US); James Donald Keller, Livermore, CA (US); Steven Edmund Pracko, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 314 days.

(21) Appl. No.: 15/619,334

(22) Filed: Jun. 9, 2017

(65) Prior Publication Data
US 2018/0358239 A1 Dec. 13, 2018

(51) Int. Cl.
*H01L 21/67* (2006.01)
*H01L 21/677* (2006.01)
*H01L 21/687* (2006.01)

(52) U.S. Cl.
CPC .. *H01L 21/67017* (2013.01); *H01L 21/67739* (2013.01); *H01L 21/67778* (2013.01); *H01L 21/68707* (2013.01)

(58) Field of Classification Search
CPC ......... H01L 21/67017; H01L 21/67739; H01L 21/67778; H01L 21/68707

USPC ....................................................... 141/65, 98
See application file for complete search history.

(56) References Cited

U.S. PATENT DOCUMENTS

| | | | | |
|---|---|---|---|---|
| 6,448,537 | B1 * | 9/2002 | Nering | H01L 21/67109 118/50.1 |
| 6,817,822 | B2 * | 11/2004 | Tokunaga | H01L 21/67772 414/217 |
| 7,066,707 | B1 * | 6/2006 | Bonora | H01L 21/67766 414/744.3 |
| 7,077,173 | B2 * | 7/2006 | Tokunaga | H01L 21/67017 141/66 |
| 7,350,544 | B2 * | 4/2008 | Bernard | H01L 21/67017 141/11 |
| 7,398,801 | B2 * | 7/2008 | Lee | H01L 21/67017 141/11 |
| 8,827,695 | B2 | 9/2014 | Hsiao et al. | |
| 9,048,271 | B2 | 6/2015 | Oosterlaken | |
| 9,272,315 | B2 * | 3/2016 | Chou | B01D 46/442 |
| 9,704,727 | B2 * | 7/2017 | Segawa | H01L 21/67017 |

(Continued)

FOREIGN PATENT DOCUMENTS

| | | |
|---|---|---|
| JP | 2015-082577 | 4/2015 |
| WO | 2014/159916 | 10/2014 |

(Continued)

*Primary Examiner* — Timothy L Maust
(74) *Attorney, Agent, or Firm* — Weaver Austin Villeneuve & Sampson LLP

(57) ABSTRACT

Disclosed are methods and apparatuses for recirculating gas in an equipment front end module ("EFEM"), including the ability to provide a gas during recirculation and control the gas flow, pressure, and composition of the environment in the EFEM during recirculation.

18 Claims, 9 Drawing Sheets

(56) References Cited

U.S. PATENT DOCUMENTS

| | | |
|---|---|---|
| 2005/0111935 A1 | 5/2005 | Kim et al. |
| 2014/0262979 A1 | 9/2014 | Bonora et al. |
| 2014/0363258 A1 | 12/2014 | Iwamoto et al. |
| 2015/0024671 A1 | 1/2015 | Taniyama et al. |
| 2015/0030416 A1 | 1/2015 | Sakiya et al. |
| 2015/0101482 A1 | 4/2015 | Chou et al. |
| 2015/0128441 A1 | 5/2015 | Segawa et al. |
| 2015/0170945 A1 | 6/2015 | Segawa et al. |
| 2015/0221538 A1 | 8/2015 | Ochiai et al. |
| 2015/0311100 A1 | 10/2015 | Miyajima et al. |
| 2017/0125272 A1 | 5/2017 | Salek et al. |
| 2017/0292188 A1* | 10/2017 | Nakada ................ H01L 21/205 |

FOREIGN PATENT DOCUMENTS

| | | |
|---|---|---|
| WO | 2015/005192 | 1/2015 |
| WO | 2015/095050 | 6/2015 |

* cited by examiner

US 10,566,216 B2

EQUIPMENT FRONT END MODULE GAS RECIRCULATION

BACKGROUND

Some semiconductor processing tools use equipment front end modules ("EFEMs") to transport semiconductor wafers between a storage container, such as a front opening unified pod ("FOUP") and an inner part of a semiconductor processing tool, such as a loadlock or a processing chamber. EFEMs typically consist of an enclosure that is interposed between load ports that receive such FOUPs and the loadlock(s) or processing chamber; filtered air may be flowed through this enclosure in order to maintain a clean environment around the wafers during transport through the EFEM. An EFEM typically includes a robotic arm that can transport the wafer from the FOUP, through the EFEM to other elements of the semiconductor processing tool, and back into the FOUP. An EFEM may also include, or have attached thereto, multiple load ports that each receives a single FOUP that enables wafers from multiple FOUPs to be processed within a single semiconductor processing tool.

BRIEF DESCRIPTION OF THE DRAWINGS

The various implementations disclosed herein are illustrated by way of example, and not by way of limitation, in the figures of the accompanying drawings, in which like reference numerals refer to similar elements.

SUMMARY

Figure 1:
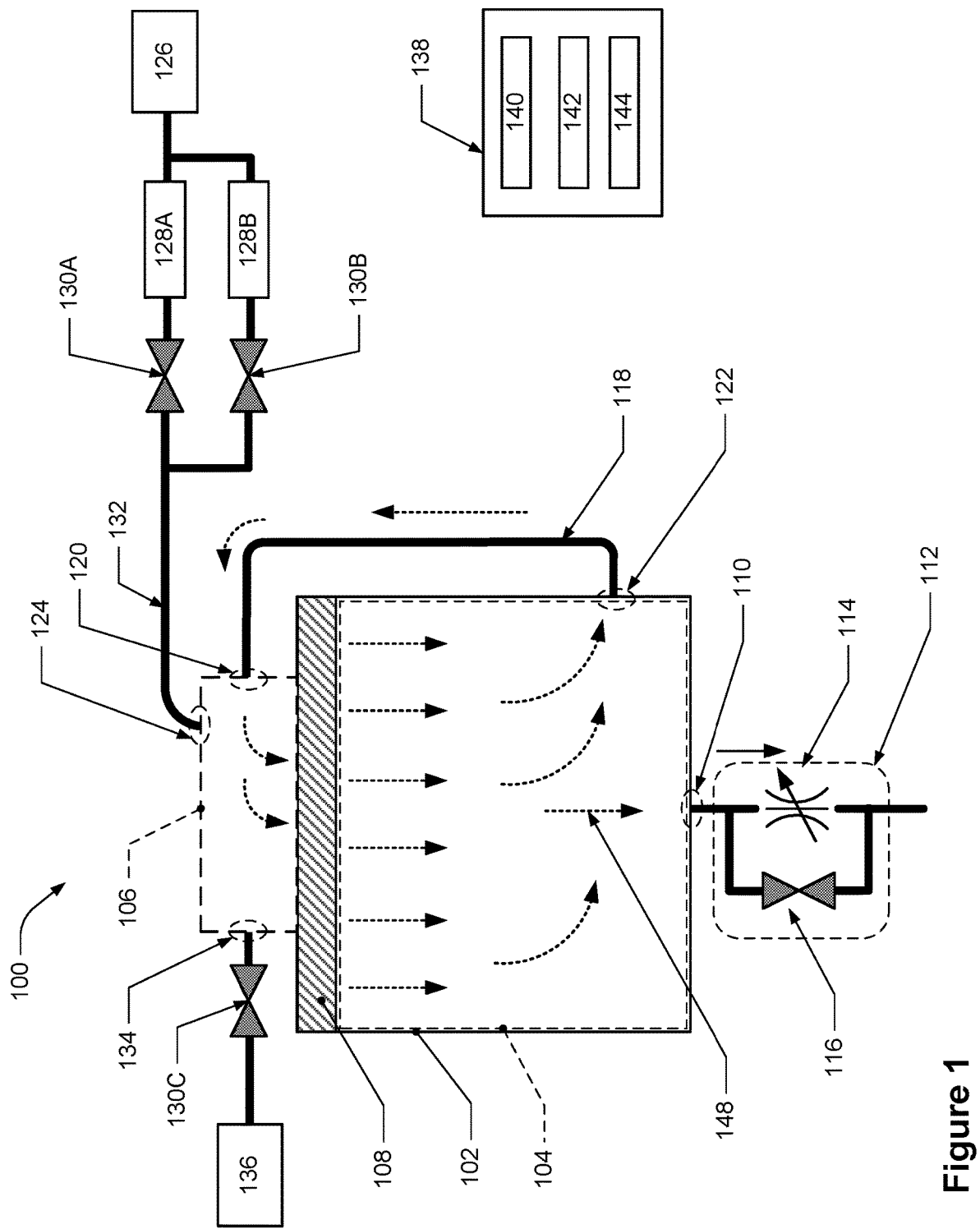
FIG. 1 depicts a first example apparatus.

Details of one or more implementations of the subject matter described in this specification are set forth in the accompanying drawings and the description below. Other features, aspects, and advantages will become apparent from the description, the drawings, and the claims.

In one embodiment, an apparatus may be provided. The apparatus may include an equipment front end module ("EFEM") that may have a mini-environment, an intake plenum fluidically connected to the mini-environment, an EFEM gas outlet at the bottom of the EFEM and fluidically connected to the mini-environment, and a fan unit configured to cause gas flowed from the intake plenum to move through the mini-environment. The apparatus may also include an exhaust mechanism fluidically connected to the EFEM gas outlet and configured to be transitionable between at least a plurality of first open configurations and a plurality of second open configurations that have flow conductances less than the flow conductances of the plurality of first open configurations, a recirculation duct that has a first end fluidically connected to the intake plenum and a second end fluidically connected to the mini-environment, a first gas supply inlet fluidically connected to the intake plenum and configured to fluidically connect with a first gas supply, a second gas supply inlet fluidically connected to the intake plenum and configured to fluidically connect with a second gas supply and a controller. The controller may be configured to (a) cause gas recirculation within the EFEM by causing gas to flow from the mini-environment, through the recirculation duct and the intake plenum, and back into the mini-environment, (b) cause, during (a), a first gas to flow from the first gas supply and into the intake plenum at a first flowrate while the exhaust mechanism is in one or more of the first open configurations, (c) cause, during (a) and after (b), the first gas to flow from the first gas supply and into the intake plenum at a second flowrate less than the first flowrate while the exhaust mechanism is in one or more of the second open configurations, and (d) cause a second gas to flow from the second gas supply and into the intake plenum.

In some embodiments, the exhaust mechanism may include a throttle valve.

In some embodiments, the apparatus may further include a pressure sensor configured to measure a pressure in the mini-environment. The controller may also be further configured in (b) to adjust the configuration of the exhaust mechanism between the one or more first open configurations, based, at least in part, on the pressure of the mini-environment, and the controller may be further configured in (c) to adjust the configuration of the exhaust mechanism between the one or more second open configurations based, at least in part, on the pressure of the mini-environment.

In some such embodiments, the controller may be further configured to: (e) determine whether the pressure in the mini-environment is at, above, or below a first threshold pressure, the controller may be further configured in (b) to adjust the configuration of the exhaust mechanism based, at least in part, on the determination in (e), and the controller may be further configured in (c) to adjust the configuration of the exhaust mechanism based, at least in part, on the determination in (e).

In some other such embodiments, the controller may be further configured to determine, during (b) and/or (c), whether a leak is present in the EFEM based, at least in part, on the pressure in the mini-environment and a flowrate of the first gas into the intake plenum, and to cause, based on the determination that a leak is present in the EFEM, the exhaust mechanism to transition to a third open configuration that has a flow conductance greater than or equal to a maximum flow conductance of the plurality of second open configurations, the flow of first gas flow from the first gas supply to the intake plenum to stop, and the second gas to flow from the second gas supply to the intake plenum.

In some further such embodiments, the exhaust mechanism may include a throttle valve and an exhaust bypass valve fluidically connected in parallel with the throttle valve, and causing the exhaust mechanism to move to a third open configuration may include causing the exhaust bypass valve to transition to an open configuration.

In some other further such embodiments, the apparatus may further include a flowrate sensor configured to detect a flowrate of gas flowing through the first gas supply inlet.

In some other such embodiments, the controller may be further configured to (f) cause the exhaust mechanism to move to a closed configuration, (g) cause, after (f), gas to flow through the intake plenum and into the mini-environment at a third flowrate, and (h) determine, during or after (g), whether a leak is present in the EFEM based, at least in part, on the pressure in the mini-environment and on the third flowrate.

In some further such embodiments, the controller may be further configured to cause, based on a determination of the presence of a leak in the EFEM in (h), the exhaust mechanism to transition to a third open configuration that has a flow conductance greater than flow conductance of the plurality of second open configurations, and the second gas to flow from the second gas supply to the intake plenum.

In some embodiments, the controller may be further configured to determine an outflow rate of gas from the mini-environment through the exhaust mechanism, determine, during (b), whether a leak is present in the EFEM based, at least in part, on the first flowrate and the outflow rate of gas from the mini-environment, determine, during (c), whether a leak is present in the EFEM based, at least in part, on the first flowrate and an outflow rate of gas from the mini-environment, cause, based on a determination that a leak is present in the EFEM, one or more of an alarm to occur, and the exhaust mechanism to transition to a third open configuration that has a flow conductance greater than a maximum flow conductance of the plurality of second open configurations, the flow of the first gas from the first gas supply to the intake plenum to stop, and the second gas to flow from the second gas supply to the intake plenum.

In some such embodiments, the determination of the outflow rate of gas from the mini-environment may be based on one or more of the configuration of the exhaust mechanism, a pressure of the exhaust mechanism, and a flowmeter.

In some embodiments, the apparatus may further include a first mass flow controller fluidically connected to the first gas supply inlet and configured to fluidically connect with the first gas supply and a second mass flow controller fluidically connected to the first gas supply inlet and configured to fluidically connect with the first gas supply. The controller may be further configured in (b) to cause the first mass flow controller to flow the first gas into the intake plenum at the first flowrate, and the controller may be further configured in (c) to cause the second mass flow controller to flow the first gas into the intake plenum at the second flowrate.

In some embodiments, the apparatus may further include an oxygen sensor configured to measure an oxygen level in the mini-environment, and a moisture sensor configured to measure a moisture level in the mini-environment. The controller may be further configured in (c) to adjust the flowrate of the first gas based, at least in part, on the oxygen level and the moisture level of the mini-environment.

In some such embodiments, the apparatus may further include a pressure sensor configured to measure a pressure in the mini-environment. The controller may be further configured in (b) to adjust the configuration of the exhaust mechanism between the one or more first open configurations, based, at least in part, on one or more of: the pressure of the mini-environment, the oxygen level, and the moisture level of the mini-environment. The controller may also be further configured in (c) to adjust the configuration of the exhaust mechanism between the one or more second open configurations based, at least in part, on one or more of: the pressure of the mini-environment, the oxygen level, and the moisture level of the mini-environment.

In some embodiments, the apparatus may further include a loadport mounting hole located on the EFEM and a latch that has a housing and a piston, and is configured to position the piston in a retracted position and an extended position. The latch may be mounted to the EFEM such that when the piston is in the extended position the piston covers at least a portion of the loadport mounting hole when viewed along the center axis of the load port mounting hole, and when the piston is in the retracted position the piston does not cover the loadport mounting hole when viewed along the center axis of the load port mounting hole. The controller may be further configured to cause the piston to be in the extended position during (a), (b), (c), and (d).

In some such embodiments, the apparatus may further include an oxygen sensor configured to measure an oxygen level in the mini-environment. The controller may be further configured to cause, based on a determination that the oxygen level in the mini-environment is below a second threshold value, the piston to be in the extended position.

In some such embodiments, the apparatus may further include a loadport connected to the EFEM. A bolt may extend through a hole of the loadport and through the loadport mounting hole to thereby connect the loadport to the EFEM, when the piston is in the extended position the piston covers at least a portion of the bolt when viewed along the center axis of the bolt, and when the piston is in the retracted position the piston does not cover the bolt when viewed along the center axis of the bolt.

In some embodiments, the controller may be further configured to cause, during (b) or (c), the exhaust mechanism to transition to a third open configuration that has a flow conductance greater than flow conductance of the plurality of second open configurations, the flow of the first gas from the first gas supply to the intake plenum to stop, and the second gas to flow from the second gas supply to the intake plenum.

In one embodiment, a method for recirculating gas within an equipment front end module ("EFEM") that has a mini-environment, an intake plenum fluidically connected to the mini-environment, and an EFEM gas outlet at the bottom of the EFEM and fluidically connected to the mini-environment, may be provided. The method may include (a) recirculating gas through the EFEM by causing gas to flow from the mini-environment, through a recirculation duct and the intake plenum, and back into the mini-environment, (b) flowing, during (a), a first gas from a first gas supply and into the intake plenum at a first flowrate while an exhaust mechanism that is fluidically connected to the EFEM gas outlet is in one or more first open configurations, and (c) flowing, during (a) and after (b), the first gas from the first gas supply and into the intake plenum at a second flowrate that is less than the first flowrate while the exhaust mechanism is in one or more second open configurations that have lower flow conductancees than the one or more first open configurations.

In some embodiments, (b) may further include adjusting the configuration of the exhaust mechanism between two or more first open configurations based, at least in part, on a pressure of the mini-environment, and (c) may further include adjusting the configuration of the exhaust mechanism between two or more second open configurations based, at least in part, on the pressure of the mini-environment.

In some embodiments, (b) may further include adjusting the configuration of the exhaust mechanism between two or more first open configurations based, at least in part, on an oxygen level of the mini-environment and/or a moisture level of the mini-environment, and (c) may further include adjusting the configuration of the exhaust mechanism between two or more second open configurations based, at least in part, on the oxygen level of the mini-environment and/or the moisture level of the mini-environment.

In some embodiments, the method may further include (d) determining whether a leak is present in the EFEM, and (e) based on the determination in (d), transitioning the exhaust mechanism to a third open configuration that has a flow conductance greater than flow conductance of the second open configurations, stopping the flow of first gas from the first gas supply to the intake plenum, and flowing a second gas from a second gas supply to the intake plenum.

In some such embodiments, (d) may further include determining whether a leak is present in the EFEM based on one or more of a pressure of the mini-environment, the first flowrate, the second flowrate, and an outflow rate of gas from the mini-environment.

DETAILED DESCRIPTION

Importantly, the concepts discussed herein are not limited to any single aspect or implementation discussed herein, nor to any combinations and/or permutations of such aspects and/or implementations. Moreover, each of the aspects of the present invention, and/or implementations thereof, may be employed alone or in combination with one or more of the other aspects and/or implementations thereof. For the sake of brevity, many of those permutations and combinations will not be discussed and/or illustrated separately herein.

A semiconductor processing tool ("tool") may have an equipment front end module ("EFEM") that is generally used to transport a wafer between a wafer transport unit, such as a front opening unified pod ("FOUP"), and a location inside the tool. The EFEM may have a plenum volume (hereinafter a "mini-environment"), that is bounded by EFEM walls, a load port that receives and interfaces with a FOUP (load ports may frequently be removable from the EFEM, allowing for equipment changeout or for any of a variety of different load ports to be used with an EFEM), a first access port that enables a wafer to be transported between the FOUP and the mini-environment, a second access port that interfaces with a loadlock or other aspect of the tool, and that also enables a wafer to be transported between the loadlock and the first access port, and a wafer handling robot that may unload a wafer from the FOUP, transport the wafer through the mini-environment and to another location within the tool, and transfer a wafer back into the FOUP. For example, a tool may have a chamber for processing wafers (such processing may include continuous vapor deposition, atomic layer deposition, atomic layer etch, etc.) that is kept at a vacuum or low pressure environment, a loadlock, and an EFEM. The tool may receive a FOUP at the load port that contains unprocessed or partially processed wafers, and the EFEM may unload a wafer from the FOUP and transfer it through the mini-environment to another location within the tool, such as the loadlock, into the processing chamber, to another wafer handling robot, or through the loadlock to another location on the vacuum/low pressure side of the loadlock. After being processed within the chamber, the wafer is transported back through the loadlock, through the mini-environment, and into the FOUP.

In many current EFEMs, it has been discovered that the composition of gas within the mini-environment may adversely affect a wafer as it passes through the mini-environment. For instance, conventional EFEMs flow Fab facility air (the air within the semiconductor fabrication facility) through the mini-environment under conditions that cause such air to be at a positive pressure within the mini-environment. Such positive pressure is used to ensure that air from outside the EFEM does not get sucked into the EFEM through the EFEM walls (conventional EFEMs are not hermetically sealed, as achieving a hermetic seal in such a large structure would be prohibitively expensive), which might potentially contaminate the wafers. The facility air that is intentionally flowed into the EFEM is passed through a fan filter unit that conditions the air by removing particulates and other contaminants from it before it reaches the mini-environment. While facility air is typically fairly clean to begin with, the composition of the Fab cleanroom air may nevertheless have an oxygen level (e.g., at about 20.9% oxygen) and/or a moisture level that adversely affects a wafer, such as by causing unwanted oxidation or corrosion of a wafer. Consequently, when a wafer is within a traditional EFEM mini-environment that contains the Fab cleanroom air, the moisture and/or oxygen levels of that Fab cleanroom air may adversely affect the wafer.

Accordingly, embodiments of the present disclosure include an EFEM that reduces the oxygen and/or moisture of the air in the mini-environment. As discussed below, this may include flowing an inert gas into, and recirculating the inert gas within, the mini-environment at various flowrates while a variable configuration exhaust mechanism of the EFEM is at different open configurations. The EFEMs discussed herein are considered "sealed" EFEMs which means that its doors, latches, panels, ports, windows, conduit, ducts, and the like have been sealed to create an inside plenum volume that is sealed from the environment outside the EFEM. In some embodiments, it is to be understood that this "sealing" may not be a full, complete sealing such that some minor leaks may exist in the EFEM (which may be caused by, for example, the design of the EFEM, manufacturing defects, wear and tear, adjustments, or damaged parts).

FIG. 1 depicts a first example apparatus of the present disclosure. As can be seen, the apparatus 100 includes an EFEM 102 that has a mini-environment 104, an intake plenum 106, fan unit 108 (the fan unit 108 may also include a filter unit to filter the gas that flows through the fan unit 108), and an EFEM gas outlet 110. The mini-environment 104 is a plenum volume that is bounded, at least in part, by walls of the EFEM 102 and, as mentioned above, may be considered the environment through which wafers are transported, such as between a FOUP and another part of a tool; it is indicated with a dashed line boundary. The intake plenum 106 is fluidically connected to the mini-environment 104 such that gas that is flowed into the intake plenum may flow into the mini-environment 104. Gas may first be flowed into the intake plenum 106, also depicted with a dashed line boundary, before being flowed into the mini-environment 104 in order to allow for the gas to mix or dissipate in order to create a more uniform, laminar air flow through the mini-environment. In some embodiments, like depicted in FIG. 1, the intake plenum 106 may be positioned on the top of the EFEM 102 in order to assist air flow through the mini-environment 104. In some embodiments, the intake plenum 106 may be located in other locations on the EFEM, such as on a side or the bottom of the EFEM 102, as well as other locations not located on the actual EFEM but still fluidically connected to the mini-environment. For example, the intake plenum 106 may be positioned on the bottom of the EFEM and fluidically connected to the mini-environment 104 (in some such implementations, the EFEM gas outlet 110 may instead be connected with the intake plenum 106). The intake plenum 106 may also be located in a position that is not directly physically contacting the EFEM, but fluidically connected to the mini-environment 104, such as through the use of piping or other ducts. In such embodiments, gas still may flow between the intake plenum 106 and the mini-environment 104.

The fan unit 108 may include one or more fans and one or more motors that are configured to cause gas that has been flowed into the intake plenum 106 to move downward into the mini-environment 104, as indicated by the dotted-line arrows. For example, in FIG. 1 the fan unit 108 is vertically interposed between and fluidically connected to the intake plenum 106 and the mini-environment 104, and is configured to cause gas to flow, e.g., by drawing the gas downward, from the intake plenum 106, through the fan unit 108, and downward into the mini-environment 104. The fan unit 108 may be located at different positions within the apparatus, such as above the intake plenum 106, and still be configured to cause gas that has been flowed from the intake plenum 106 to move downward into the mini-environment 104 as described. In some embodiments, it is the fan unit 108 that is the entire or substantial motive force behind gas recirculation and movement within the EFEM; the gas flow of the first gas, the second gas, or other gases flowed into the mini-environment 104 may cause some gas movement and recirculation within the EFEM, but the fan unit 108 supplies the primary moving force for the gas flow in the EFEM.

The EFEM gas outlet 110 may be located at the bottom of the EFEM 102 and fluidically connected to the mini-environment 104 such that gas may flow out of, or escape, the mini-environment 104 through the EFEM gas outlet 110 and into an exhaust system of the tool or the Fab cleanroom (collectively revered to as "exhaust") as indicated by the dotted arrow 148. The EFEM gas outlet 110 may be fluidically connected to an exhaust mechanism 112 (located within the dashed box labeled 112 in FIG. 1) that is configured to control the gas flow from the mini-environment 104, through the EFEM gas outlet 110, and to the exhaust. The exhaust mechanism 112 is also configured to be transitionable, or changeable, between multiple configurations that increase or decrease the flow conductance through the exhaust mechanism 112. For instance, as shown in FIG. 1, the exhaust mechanism 112 may include a variable position valve 114, such as a throttle valve 114, that is configured to be adjustable between multiple configurations that vary the flow conductance through the throttle valve 114. For instance, the "fully open" configuration of the throttle valve 114 may be considered the configuration that has the highest flow conductance through the throttle valve 114, while the remaining open configurations (also referred to as "semi-open configurations") have less flow conductance than the fully open configuration; the throttle valve 114 also includes a closed configuration which has zero or near-zero flow conductance (throttle valves are typically not hermetically sealing valves, as a hermetic seal is usually not compatible with such valves). It may also be considered that the variable position valve 114, including the throttle valve, may be transitioned between a plurality of first open configurations that may include the "fully open" configuration and one or more semi-open configurations, or just one or more semi-open configurations, and a plurality of second open configurations that includes two or more semi-open configurations and that have lower flow conductances than the flow conductances of the plurality of first open configurations.

In some embodiments, the exhaust mechanism 112 may also include an exhaust bypass valve 116 that is fluidically connected in parallel with the variable position valve 114, like depicted in FIG. 1. The exhaust bypass valve 116 may have a higher flow conductance than the variable position valve 114 and it may not be a variable position valve, i.e., it may only have a closed configuration and an open configuration or may not be able to be controlled as finely as a variable position valve such as a throttle valve. In such embodiments, the overall configuration of the exhaust mechanism 112 includes the individual configurations of both the variable position valve 114 (e.g., between multiple semi-open configurations) and the exhaust bypass valve 116 (e.g., between the open configuration and the closed configuration). For instance, the flow conductance of the exhaust mechanism 112 is higher when the variable position valve 114 is in the fully open configuration and the exhaust bypass valve 116 is in an open configuration, than when the variable position valve 114 is in the open configuration and the exhaust bypass valve 116 is in the closed configuration.

The apparatus 100 also includes a recirculation duct 118 that has a first end 120 that is fluidically connected to the intake plenum 106 and a second end 122 that is fluidically connected to the mini-environment 104 at a bottom section of the EFEM 102 (each end is identified within a dashed ellipse and individually labeled). The fluidic connections of the first end 120 and the second end 122 of the recirculation duct 118 enable gas to flow between the mini-environment 104 and the intake plenum 106 through the recirculation duct 118. For example, the configuration of the EFEM 102, including the fan unit 108 and the location of the second end 122 of the recirculation duct 118, enables gas to recirculate through the EFEM 102 by having the fan unit 108 cause gas that is located in the intake plenum 106 to move downward into the mini-environment 104, through the mini-environment 104, through the second end 122, through the recirculation duct 118 (the amount of recirculation may depend on the amount of gas that is allowed to flow out through the exhaust mechanism 112), and through the first end 120 back into the intake plenum 106, as indicated by the dotted directional arrows in FIG. 1. In some embodiments, during recirculation the fan unit 108 may operate at a substantially constant speed that causes a flowrate of between about 800 cubic feet per minute ("cfm") and about 2,000 cfm, for example.

While in some embodiments the location of the second end 122 may differ, including on a side wall of the EFEM 102 or on a bottom surface of the EFEM 102, the placement of the second end 122 is configured to enable recirculation of gas through the EFEM. In some embodiments, the second end 122 may be located in a bottom section of the EFEM 102 which may be, for instance, at a location on the EFEM 102 that is less than half the height of the mini-environment 104, less one quarter of the height of the mini-environment 104, or less than 10% of the height of the mini-environment 104.

In some embodiments, as noted above, the intake plenum 106 may be located in other positions, including, for example, a location in which the intake plenum 106 is fluidically interposed along the recirculation duct 118. For instance, the recirculation duct 118 may have two sections and the intake plenum 106 may be fluidically interposed between these two sections. The first section of the recirculation duct 118 may include the first end 120 and the second end 122, and the first end is still fluidically connected to the intake plenum 106 and the second end 122 is also still fluidically connected to the mini-environment 104 such that gas may flow from the mini-environment 104 through the second end 122, through the first section of the recirculation duct 118 and into the intake plenum 106 through the first end 120. The second section of the recirculation duct may include a third end and a fourth end, with the third end fluidically connected to the intake plenum 106 and the fourth end fluidically connected to the mini-environment 104. In some such example embodiments, gas may flow from the mini-environment 104 through the second end 122, through the first section of the recirculation duct 118 and into the intake plenum 106 through the first end 120, from the intake plenum 106 and into the second section through the third end, and into the mini-environment through the fourth end; gas may also flow in the reverse direction depending on pressure within the apparatus, for example.

Additionally, in some embodiments in which the intake plenum 106 is located at the bottom of the EFEM 102 (e.g., in a bottom section of the EFEM or fluidically connected to a bottom surface of the EFEM 102), the recirculation duct 118 is still considered fluidically connected to the intake plenum 106 and the mini environment 104. Here, the first end 120 is still fluidically connected to the intake plenum 106 and the second end 122 is fluidically connected to the mini-environment 104. For example, the second end 122 may be at a location that may be at the top, or in a top section, of the mini-environment 104, such as at a location on the EFEM 102 that is less than half the height of the mini-environment 104 from the top of the mini-environment 104, less one quarter of the height of the mini-environment 104 from the top of the mini-environment 104, or less than 10% of the height of the mini-environment 104 from the top of the mini-environment. In another example, the second end 122 may be connected to the fan unit 108 or to another plenum that is located above or below the fan unit 108, e.g., a fan plenum or a second plenum, and that is fluidically connected to the mini-environment 104 such that gas may flow through the second end, into the fan unit 108 or the other plenum, and into the mini-environment (or may flow in the reverse direction). The fan unit 108 is also still configured to cause gas to move from the intake plenum 106 into the mini-environment 104 by causing gas to flow from the mini-environment 104, into the intake plenum 106, through the recirculation duct 118, and back into the mini-environment.

As stated above, in some embodiments of the present disclosure, the apparatus is configured to cause an inert gas to flow at two different flow rates into the EFEM during gas recirculation of the EFEM while a variable configuration exhaust mechanism of the EFEM is at different open configurations. The inert gas may be flowed from a gas supply into the intake plenum. For example, as can be seen in FIG. 1, the apparatus 100 includes a first gas supply inlet 124 that is fluidically connected to the intake plenum 106 and configured to connect with a first gas supply 126 such that when the first gas supply inlet 124 is fluidically connected to the first gas supply 126, first gas may flow from the first gas supply 126 to the intake plenum 106. While the first gas supply inlet 124 is shown directly connected to the intake plenum 106, the first gas supply inlet 124 may also be directly connected to other components of the apparatus 100, such as directly to the recirculation duct 118, In some such examples, the first gas supply inlet 124 is still fluidically connected to the intake plenum 106 such that the first gas flows from the first gas supply 126, to and then through at least a part of the recirculation duct 118, and then into the intake plenum 106.

Similar to the first gas supply inlet 124, the second gas supply inlet 134 may also be directly connected to other components of the apparatus 100. For example, the second gas supply inlet 134 may be directly connected to the recirculation duct 118. In another example, if the inlet plenum 106 is located at another location on the EFEM 102, then the second gas supply inlet 134 may be directly connected to another plenum volume that is located above the fan unit 108, fluidically connected to the fan unit 108, and therefore fluidically connected to the mini-environment 104. In this other example, the second gas may be caused to flow into the other plenum, through the fan unit 108, and into the mini-environment 104, as well as from the other plenum into the recirculation duct 118.

The apparatus 100 may also be configured to cause the first gas to flow from the first gas supply 126 at two or more flowrates. The use of two or more flowrates, e.g., an initial high-flow gas fill operation followed by a lower-flow gas recirculation operation, while having the exhaust mechanism 112 in multiple open positions enables a quick purging and pressurization of the mini-environment 104 and then a low gas usage during the gas recirculation operation while maintaining a stable pressure of the mini-environment and a low oxygen and moisture level. For instance, such configuration may include the use of mass flow controllers ("MFCs") and valves, such as MFCs 128A and 128B and valves 130A and 130B, while in another example a pressure regulator and one or more orifices may be used to control flow instead of MFCs. The MFCs may be used in series or parallel and may be configured to cause the same or different flowrates. For example, MFC 128A may be configured to cause the first gas to flow at a first flowrate through the first supply piping 132 to the intake plenum 106 when the valve 130A is open; similarly MFC 128B may be configured to cause the first gas to flow at a second flowrate that is less than the first flowrate through the first supply piping 132 to the intake plenum 106 when the valve 130B is open. In some embodiments, the first flowrate may be up to substantially 500 standard liters per minute ("slm") and the second flowrate may be up to substantially 100 slm. "Substantially" here means within +/−5%. MFCs may be used because of their ability to produce a steady, consistent gas flowrate, which causes a more stable, consistent gas flow that reduces pressure fluctuations and also enables the gas flowrates to be known without separately measuring the gas flow. The first supply gas may be an inert gas, such as nitrogen ("$N_2$") (nitrogen is not technically inert, but is often considered inert in the context of usage in an EFEM, and in the present disclosure as well, since nitrogen will generally not react with processed or unprocessed wafers), Argon, or extreme clean dry air (XCDA; also not technically inert, but may be considered as sufficiently inert in the context of usage in an EFEM).

Other gas may also be flowed into the intake plenum 106 from a second gas supply, such as air flowed into the Fab cleanroom (e.g., Fab air). In FIG. 1, a second gas supply inlet 134 is fluidically connected to the intake plenum 106 and configured to connect with a second gas supply 136 such that second gas may flow from the second gas supply 136 into the intake plenum 106. Valve 130C is fluidically interposed between the second gas supply inlet 134 and the second gas supply 136, and is configured to control gas flow from the second gas supply 136 to the intake plenum 106.

The various operations of the EFEM, such as during inert gas fill, gas recirculation, and flush-out of the EFEM, are discussed in more detail below, and may be controlled by a controller, sometimes referred to as a system controller. In FIG. 1, the system controller 138 is employed to control process conditions and hardware states of a semiconductor processing tool, including the gas delivery systems, process stations, chambers, robots, EFEM, and loadlock. System controller 138 may include one or more memory devices 140, one or more mass storage devices 142, and one or more processors 144. Processor 144 may include one or more CPUs, ASICs, general-purpose computer(s) and/or specific purpose computer(s), one or more analog and/or digital input/output connection(s), one or more stepper motor controller board(s), etc.

In some embodiments, system controller 138 controls some or all of the operations of the process tool including the operations of the apparatuses listed herein, such as the EFEM 102, the fan unit 108, the exhaust mechanism 112, valves 130A-C, MFCs 128A and 128B, and other equipment discussed herein. System controller 138 may execute machine-readable system control instructions on processor 144—the system control instructions, in some embodiments, may be loaded into memory device 140 from mass storage device 142. The system control instructions may include instructions for controlling the parameters of a particular process performed by the process tool, flowrates and functions of the fan unit 108, positions and configurations of valves 130A-C and the exhaust mechanism 112, the timing and flow of the MFCs 128A and 128B, and other components or aspects of the apparatuses discussed herein. System control instructions may be configured in any suitable way.

In some embodiments, the system control software may include input/output control (IOC) sequencing instructions for controlling the various parameters described above. Other computer-readable instructions and/or programs stored on mass storage device 142 and/or memory device 140 associated with system controller 138 may be employed in some embodiments. Examples of programs or sections of programs include an EFEM control program. As discussed in greater detail below, an EFEM control program may include instructions for components of the EFEM and those connected to the EFEM that are used to control the pressure and flow of gases into and out of the EFEM.

In some embodiments, there may be a user interface associated with system controller 138. The user interface may include a display screen, graphical software displays of the apparatus and/or process conditions, and user input devices such as pointing devices, keyboards, touch screens, microphones, etc.

Signals for monitoring the processes, the tool, and the apparatus may be provided by analog and/or digital input connections of system controller 138 from various sensors. The signals for controlling the processes may be output on the analog and/or digital output connections of the tool, including the EFEM and the apparatus. Non-limiting examples of sensors that may be monitored include mass flow controllers (MFCs), pressure sensors (such as manometers), thermocouples, valve configurations, moisture and oxygen sensors, flowrates, gas supplies, etc. Appropriately programmed feedback and control algorithms may be used with data from these sensors to control the apparatus as described herein.

System controller 138 may provide machine-readable instructions and control logic for implementing the herein-described apparatus functions, operations, and configurations. The instructions may control a variety of parameters, such as flows from the MFCs 128A and 128B, operation of the fan unit 108, configurations of the exhaust mechanism 112 and the valves 130A-C, and flowrates of gas within EFEM 102.

As mentioned above, some embodiments of the present disclosure create and maintain an inert environment within the mini-environment. In some embodiments, this inert environment may have an oxygen level at or less than 250 ppm and a water (i.e., moisture) level at or less than 250 ppm; some other embodiments may have oxygen level at or less than 100 ppm and a water level at or less than 100 ppm. The controller 138 described above is configured to control the elements of the apparatus as described in order to, for instance, create and maintain the inert environment in the mini-environment and those operations described herein.

Figure 2:
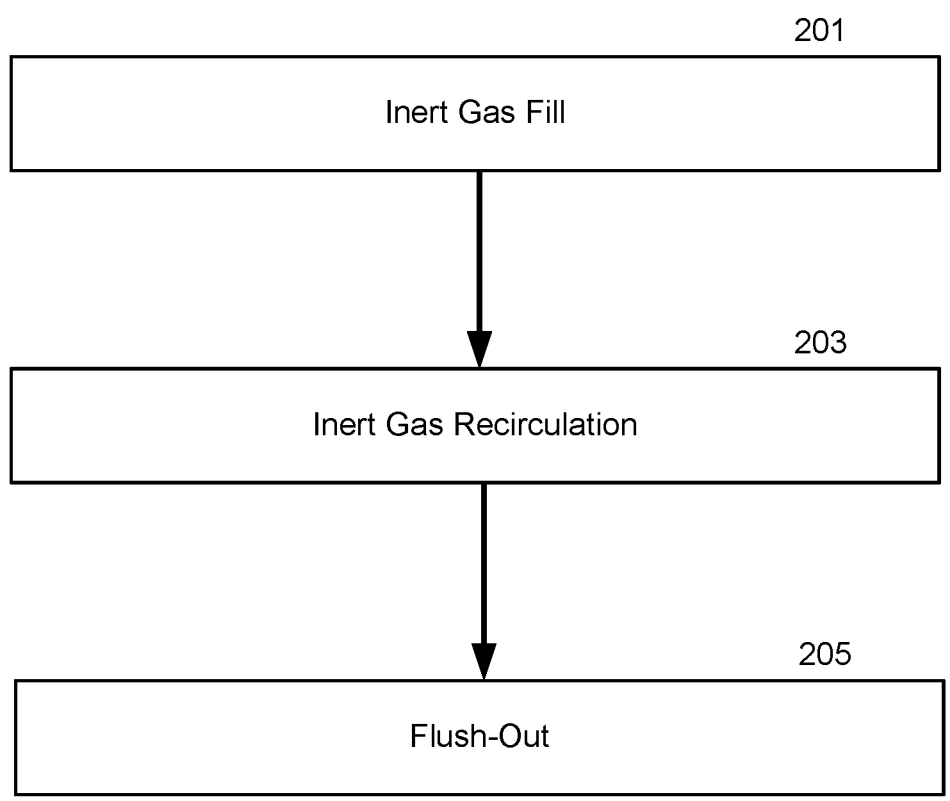
FIG. 2 depicts an example technique of creating and maintaining an inert environment in an equipment front end module ("EFEM").

FIG. 2 depicts an example technique of creating and maintaining a sufficiently inert environment in the EFEM (reference herein to an "inert environment" in the EFEM is to be understood to refer to an EFEM environment that is sufficiently inert). Each block is discussed in detail below, but more generally in block 201 an inert gas fill operation is performed which includes causing an inert gas to flow into the intake plenum at a first flowrate while also causing gas recirculation within the EFEM and causing the exhaust mechanism to be in one or more first open configurations. This operation may positively pressurize the mini-environment and cause the air composition in the mini-environment to become sufficiently inert as facility air that is in the EFEM is bled out through the exhaust mechanism and replaced with the inert gas, such as lowering the moisture level to less than 100 ppm and lowering the oxygen level to less than 100 ppm.

Once the mini-environment is sufficiently inert, the EFEM may be switched to a mode in which the sufficiently inert environment is maintained by reducing (but generally not stopping) the amount of gas outflow through the exhaust mechanism, thereby increasing the amount of recirculation of the gas within the EFEM, and replacing any gas that is lost, e.g., from the EFEM through the exhaust mechanism or through leaks, with inert gas. In block 203, inert gas recirculation is performed which includes causing the inert gas to flow into the intake plenum at a second flowrate that is less than the first flowrate, while also causing gas recirculation within the EFEM and causing the exhaust mechanism to be in one or more second open configurations that have lower flow conductances than the flow conductances of the one or more first open configurations; it may also include adjusting the open configurations of the exhaust mechanism as based on, for instance, the pressure, oxygen level, and/or moisture level of the mini-environment. This operation may enable the mini-environment to remain sufficiently inert.

In some situations, it may be desirable to rapidly return the mini-environment to a state in which the atmosphere in the mini-environment is no longer inert, e.g., one in which it is composed of facility air. In block 205, a gas flush-out operation is performed in which the inert gas flow into the intake plenum is stopped, a second gas (consisting of facility air) is flowed into the intake plenum, and the exhaust mechanism is in a third open configuration. This operation may flush-out the inert gas or gases within the mini-environment, lower the pressure in the mini-environment, and change the mini-environment to not inert (e.g., having higher oxygen and moisture levels).

Figure 3:
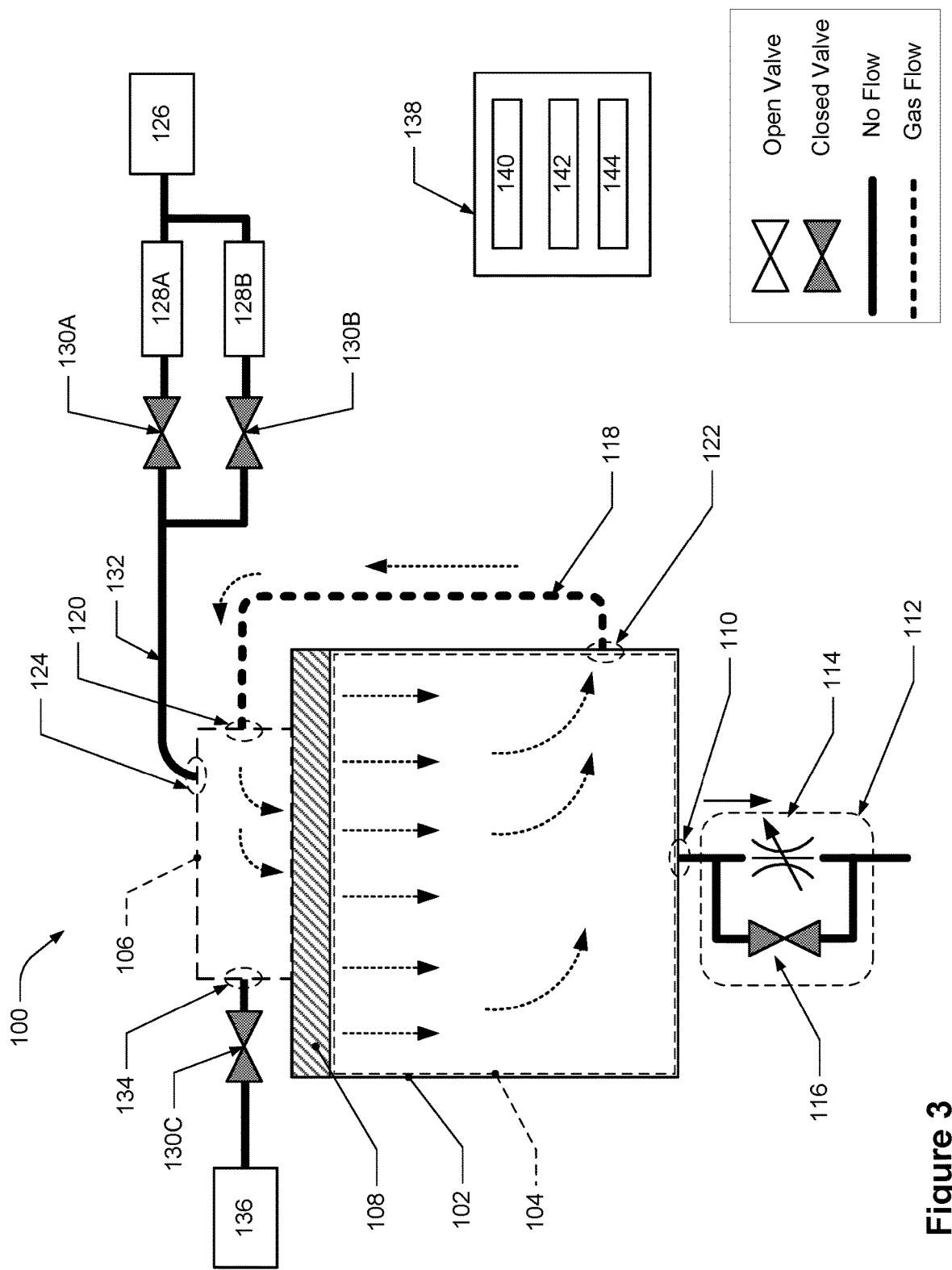
FIG. 3 depicts the apparatus of FIG. 1 in an example gas recirculation configuration.

As part of the operations described herein, the controller may include instructions to cause gas recirculation within the EFEM 102 as discussed above. FIG. 3 depicts the apparatus of FIG. 1 in an example gas recirculation configuration. As can be seen in the legend in the lower right corner of FIG. 3, a solid line of a pipe indicates that there is no gas flow through that pipe while a dotted line indicates that there is gas flow in a pipe. Additionally, a valve that is shaded indicates that it is closed while an unshaded valve indicates that it is open or in an open configuration. In this example gas recirculation configuration of FIG. 3, the controller may cause gas recirculation within the EFEM 102 by causing, e.g., by controlling the operation of the fan unit 108, gas to flow from the mini-environment 104 and into the second end 122 of the recirculation duct 118, through the recirculation duct 118, as indicated by its depiction as a dotted line, out of the first end 120 of the recirculation duct 118, through the intake plenum 106, through the fan unit 108, and back into the mini-environment 104, as also indicated by the dotted directional arrows.

Although FIG. 3 depicts one example embodiment, it may be considered that gas recirculation is the flow of gas between and through the mini-environment 104, the intake plenum 106, and the recirculation duct 118, regardless of the order these items are positioned with respect to one another. In at least some embodiments disclosed herein, the apparatus is configured such that gas may flow at least from the mini-environment to and through, whether directly or indirectly and regardless of the order, both the intake plenum and the recirculation duct, and then back into the mini-environment. For example, if the intake plenum 106 is located at the top of the mini-environment 104 like in FIG. 3, then during gas recirculation, the gas may flow according to the above description. If, like in some embodiments, the intake plenum 106 is located at the bottom of the mini-environment 104 or the EFEM 102 and the recirculation duct 118 is fluidically connected to the top, a top section of the mini-environment, or another plenum volume also fluidically connected to the fan unit 108 and the mini-environment 104 (e.g., the other plenum volume may be located on top of the EFEM 102), then gas recirculation may occur by gas flowing from the mini-environment 104, into the intake plenum 106, through the recirculation duct 118, and back into the mini-environment. Additionally, if the intake plenum 106 is interposed between two sections of the recirculation duct 118 as described above, then gas recirculation occurs by gas flowing from the mini-environment 104, through the first section of the recirculation duct, into and through the intake plenum 106, through the second section of the recirculation duct 118, and back into the mini-environment 104.

It should be noted that in FIG. 3, the inlet and outlet valves of the apparatus are shown in closed positions for purposes of illustration, and that this configuration is but one example showing how gas recirculation may occur in the apparatus. Additionally, as described herein, during normal operations of the apparatus, such as the inert gas fill operation and the inert gas recirculation operation, the exhaust mechanism is generally in at least a semi-open configuration such that gas may exit the mini-environment and flow to the exhaust. In the example of FIG. 3, valves 130A and 130B are closed such that the first gas from the first gas supply 126 cannot flow to the intake plenum 106; similarly valve 130C is closed which prevents the second gas from flowing from the second gas supply 136 to the intake plenum 106. The exhaust bypass valve 116 is also closed and the variable position valve 114 may also be considered closed, effectively closing these inlets and the outlets of the EFEM 102. However, it should also be noted that as referred to above, the EFEMs disclosed herein may not be fully sealed and may also include other ports or access points into the mini-environment, such as through a loadlock port or access port to a loadport that may create an inlet/outlet when such port is opened. Thus, one or both of the valves 130 may be opened and one or both of the mass flow controllers 128 may be used to meter out amounts of the first gas sufficient to maintain a desired degree of inertness in the gas present in the mini-environment.

As described below, gas recirculation may still occur within the EFEM 102 when one or more of the aforementioned valves are open, which, in turn, allows for gas recirculation while new gas enters into the EFEM and/or gas exits the EFEM. For instance, during an inert gas fill operation of the EFEM, inert gas may be flowed into the mini-environment while gas recirculation is occurring and while the exhaust mechanism is in one or more first open configurations.

Figure 4:
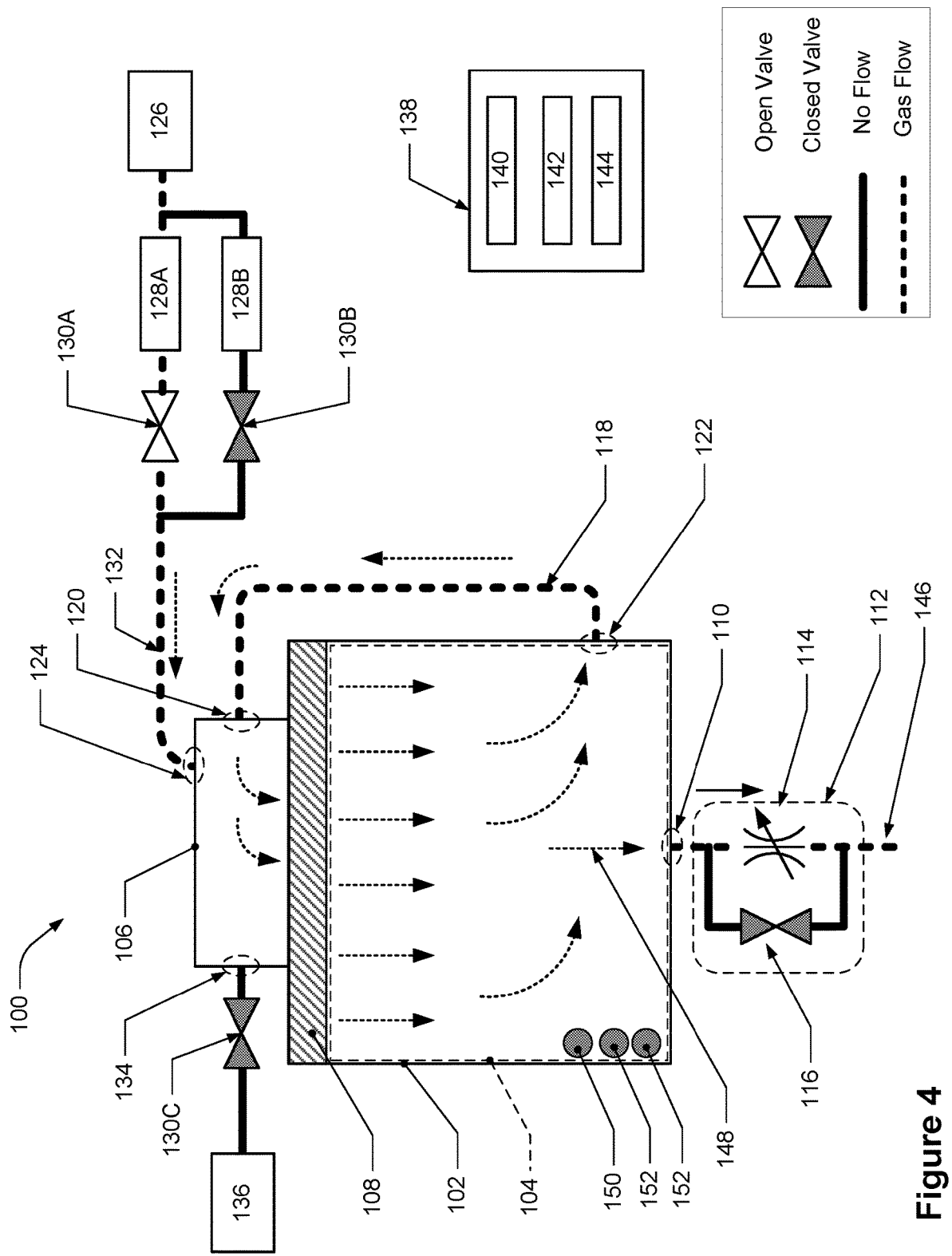
FIG. 4 depicts an example inert gas fill operation of the EFEM.

FIG. 4 depicts an example inert gas fill operation of the EFEM. Here, the controller includes instructions to cause the inert gas fill operation of the EFEM 102. As can be seen in FIG. 4, the first gas (e.g., an inert gas $N_2$) is flowing from the first gas supply 126, through first supply piping 132 and into the intake plenum 106, which may be caused by opening valve 130A and causing MFC 128A to flow the first gas at a first flowrate. In some embodiments, the first flowrate may be a relatively high flowrate, such as substantially up to 500 slm ("substantially" here means within +/−10% of the value). Additionally, gas is being caused to recirculate through the EFEM (e.g., from the mini-environment 104, through the recirculation duct 118, and into the intake plenum 106) which may be caused by having the fan unit 108 operate and cause gas within the intake plenum 106, which includes the first gas that flowed through the first gas supply inlet 124 and the recirculated gas that flowed through the first end 120, to move downward into the mini-environment 104.

As can be seen further in FIG. 4, the exhaust mechanism 112 is in one or more first open configurations which enables some gas to flow from the mini-environment, through the EFEM gas outlet 110, and to the exhaust, as indicated by the dotted line of the exhaust pipe 146 and dotted arrow 148. In FIG. 4, the exhaust bypass valve 116 is closed and throttle valve 114 may be considered in one or more of the first open configurations, which in some embodiments may include a fully open configuration. In some implementations, the exhaust bypass valve 116 may also be opened during the inert gas fill operation to allow for more rapid venting of whatever facility air remains in the mini-environment. Valve 130C is also closed to prevent the second gas, e.g., Fab air, from flowing into the intake plenum 106. The outflow through the exhaust mechanism 112 is configured to be less than or equal to the inflow of the first gas into the intake plenum 106 so that the mini-environment 104 can become positively pressurized at a first pressure, which in some embodiments may be about 0.005 in $H_2O$, 0.010 in $H_2O$, and 0.800 in $H_2O$, for example. In some embodiments, the configuration of the exhaust mechanism 112 during this inert gas fill may enable a flowrate of between about 0 to about 500 liters per minute ("lpm") to flow out of the mini-environment 104 and to the exhaust. In the inert gas fill configuration depicted in FIG. 4, the inflow of the first gas, e.g., $N_2$, into the mini-environment and the recirculation of the first gas and air in the mini-environment 104, causes the purging of moist gas and oxygen from the mini-environment 104 through the EFEM gas outlet 110, which in turn causes the mini-environment 104 to become inert, e.g., having an oxygen level less than 100 ppm and a moisture level less than 100 ppm.

In some embodiments, the apparatus may include one or more sensors that are configured to detect environmental conditions in the mini-environment 104, such as a first sensor 150 that is configured to detect pressure in the mini-environment 104, a second sensor 152 that is configured to detect oxygen in the mini-environment 104, and a third sensor 154 that is configured detect moisture in the mini-environment 104. These sensors may be communicatively connected to the controller 138, which is configured to receive data from these sensors. In some embodiments that include the second sensor 152 and the third sensor 154, the controller may be configured to cause the inert gas fill to occur until a threshold oxygen level and threshold moisture level are reached in the mini-environment 104, such as an oxygen level at or less than 100 ppm and a moisture level at or less than 100 ppm. Once these threshold levels are met during the inert gas fill operation, then the controller may be configured to cause the EFEM to initiate inert gas recirculation operation.

During some inert gas fill operations the exhaust mechanism 112 may be in a single open configuration, such as the fully open configuration, and in some other inert gas fill operations the exhaust mechanism may be adjusted between two or more open configurations. The controller may therefore be configured to adjust the exhaust mechanism 112 between one or more of the first open configurations during an inert gas fill operation. This may include adjusting the exhaust mechanism, such as the throttle valve 114, between a fully open configuration and one or more semi-open configurations that have a relatively high flow-conductance. For example, these open configurations may be considered the plurality of first open configurations mentioned above that have a flow conductance higher than the plurality of second open configurations that may be used during an inert gas recirculation operation, as discussed below. This adjustment may be based, at least in part, on the pressure, the oxygen level, and/or the moisture level of the mini-environment 104 as determined by the controller 138 using the aforementioned sensors. For example, during a fill operation the exhaust mechanism 112 conductance may be adjusted in order to prevent the mini-environment 104 from over-pressurizing (including with the known leakage) or from under-pressurizing (which may allow outside contamination to leak into the mini-environment).

Figure 5:
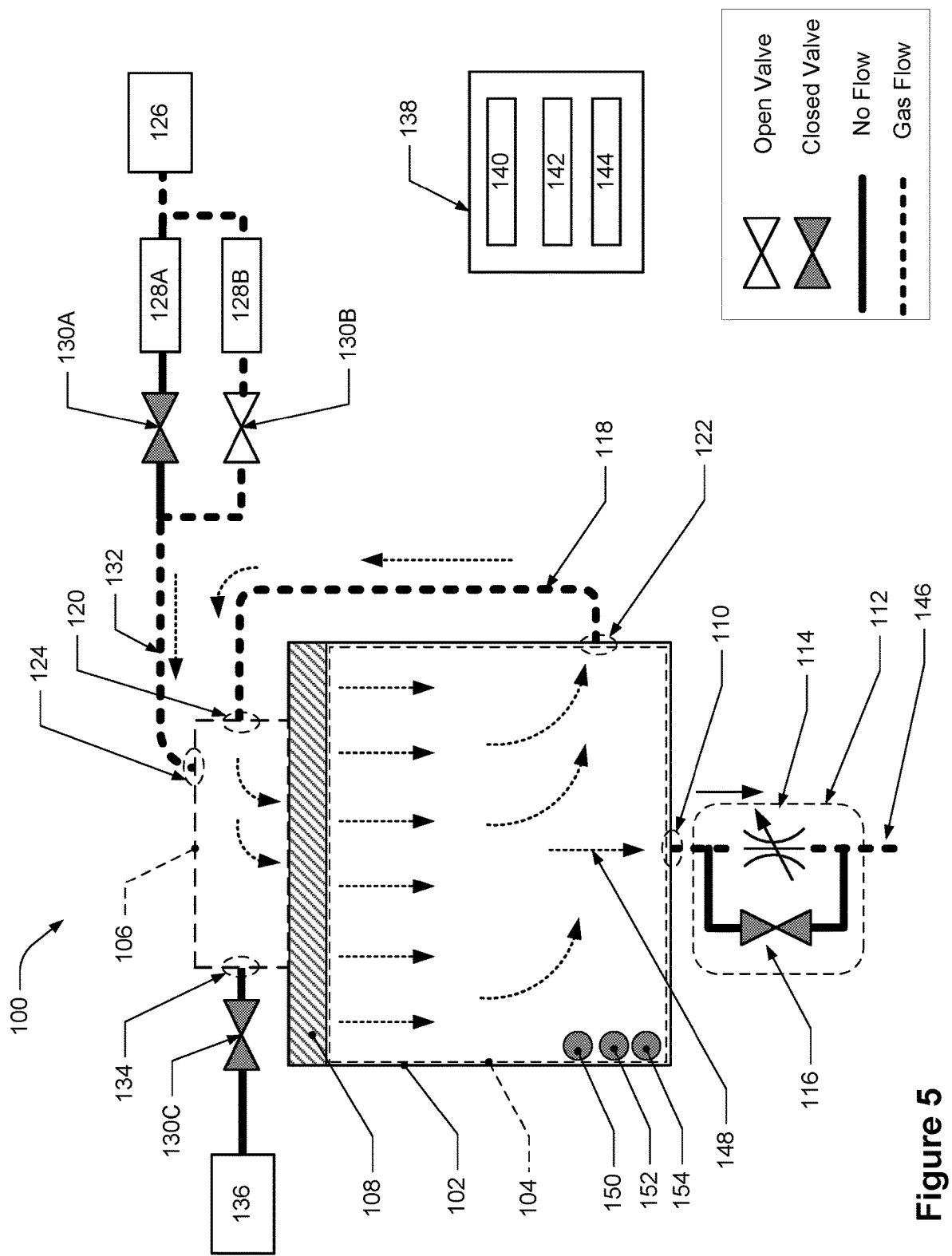
FIG. 5 depicts an example inert gas recirculation operation of the EFEM.

FIG. 5 depicts an example inert gas recirculation operation of the EFEM. During this inert gas recirculation operation, the controller may be configured to cause the inert environment in the mini-environment to be maintained, e.g., the oxygen level, the moisture level, and/or the pressure to remain substantially constant (e.g., within +/−10%). For instance, this may include the controller causing the first gas to flow from the first gas supply 126 and into the intake plenum 106 at a second flowrate that is less than the first flowrate while the exhaust mechanism 112 is in one or more of the semi-open configurations. As can be seen in FIG. 5, valve 130A is closed and valve 130B is open and MFC 128B is causing flow of the first gas from the first gas supply 126 at the second flowrate, which in some embodiments may be up to substantially 100 slm ("substantially" here means within +/−10%). The gas within the mini-environment continues to recirculate and the exhaust mechanism is in a semi-open configuration that causes a lower flow conductance than during the inert gas fill operation through the EFEM gas outlet 110, through the exhaust pipe 146, and to the exhaust. Like above in FIG. 4, valve 130C and exhaust bypass valve 116 are closed during the inert gas recirculation operation.

During the inert gas recirculation operation described herein, there may be various pressure and flow fluctuations in the mini-environment 104 that occur because of access ports of the EFEM 102 opening or closing, such as the loadlock or load port, movement of a wafer handling robot (loaded with a wafer or unloaded) through the mini-environment 104, or leaks in the EFEM 102. The apparatus 100 is configured to account for these pressure and flow fluctuations of the mini-environment 104 in order to maintain a substantially constant pressure, oxygen level, and/or moisture level in the mini-environment 104 ("substantially" here means at least within +/−10% of a target setpoint for each of these values). In some embodiments, in order to achieve this, the apparatus 100 is configured to adjust the configuration of the exhaust mechanism 112 such that the pressure, oxygen level, and/or moisture level in the mini-environment 104 remain substantially constant.

For example, in the embodiment shown in FIG. 5, the apparatus 100 is configured to detect the pressure of the mini-environment 104 using the first sensor 150 and to determine whether the pressure in the mini-environment 104 is at, above, or below a first threshold pressure. This threshold pressure is set by a user or may be hard-coded into the instructions used by the controller and is a positive pressure above the pressure of the environment outside the EFEM. If the pressure in the mini-environment 104 is above or below the first threshold pressure, then the controller 138 may be configured to adjust the configuration of the throttle valve 114, e.g., adjusting its flow conductance in order to maintain a substantially constant pressure in the mini-environment 104. For instance, if the pressure of the mini-environment 104 drops below the desired pressure setpoint, then the throttle valve 114 may be adjusted to lower its flow conductance in order to reduce the flow of gas through the EFEM gas outlet 110 and to the exhaust. In some embodiments, the adjustment of the exhaust mechanism 112 may also be based on the inflow rate of gas into the intake plenum 106, such as the flowrate of the first gas into the intake plenum 106, which in some embodiments may be considered substantially constant (e.g., within +/−5% of a target value).

This technique differs from and is advantageous over traditional EFEM flow control configurations such as those that attempt to maintain a substantially constant pressure in an environment by adjusting the flowrate of gas into the environment. For instance, adjusting the flowrate into the mini-environment to adjust the pressure in the mini-environment may cause undesirable pressure fluctuations, may require additional pumping and flow components (such as a pump), and may use more inert gas than the techniques described herein. Additionally, without the use of a transitionable exhaust mechanism discussed herein, it may not be feasible or possible to (a) flow the first gas into the mini-environment at the low flowrate, e.g., the second flowrate, because this low flow may not be able to maintain the desired positive pressure in the mini-environment and (b) flow the first gas into the mini-environment at the higher flowrate, e.g., the first flowrate, because this flowrate may create a pressure in the mini-environment that is too high and could cause gasket failure and higher leak rates which may lead to a low oxygen environment outside the mini-environment which poses a safety hazard to users near the EFEM.

The adjustment of the exhaust mechanism 112 during a gas recirculation operation may also be based on an oxygen level of the EFEM, a moisture level of the EFEM, or both. As stated above, the oxygen level in the mini-environment 104 may be determined by the second sensor 152 and the moisture level in the mini-environment 104 may be determined by the third sensor 154. The controller 138 may be configured to adjust the exhaust mechanism 112 based on oxygen level of the EFEM, a moisture level of the EFEM, or both, in order to maintain a target oxygen level and/or moisture level in the mini-environment. For example, if the oxygen level is too high in the mini-environment, then the exhaust mechanism may be transitioned to a less open configuration in order to cause more of the first gas to stay within the mini-environment 104, the flowrate of the first gas into the intake plenum 106 may be increased, or both of these actions may be performed. A reduction of the flowrate through the exhaust mechanism 112 results in an increased system pressure which reduces entrainment of outside oxygen or moisture and helps maintain a lower oxygen ppm and moisture ppm and levels in the mini-environment 104. An increase of flow of the first gas into the intake plenum 106, and therefore the mini-environment 104, may increase system pressure and also increase the dilution or the displacement rate of any moisture or oxygen trapped within the mini-environment 104.

In some embodiments, the apparatus 100 is also configured to adjust the flowrate of the first gas into the intake plenum in order to adjust and maintain the pressure, oxygen level, and/or moisture level in the mini-environment 104 during the inert gas fill operation or the inert gas recirculation operation, or both. For instance, the flowrate of the first gas, e.g., $N_2$, may modify the properties of the mini-environment, including the rate of displacement within the mini-environment, the oxygen level, and the moisture level. Additionally, the apparatus may be further configured to account for a change in flowrate into the mini-environment by further adjusting the exhaust configuration based on this change in flowrate. For example, if the flowrate of the first gas into the inlet was caused to increase in order to modify, e.g., lower, the oxygen level in the mini-environment 104, which in turn may cause the pressure of the mini-environment 104 to increase, then the controller may be configured to adjust the exhaust mechanism 112 to have a higher flow conductance to account for this change in pressure in order to maintain a substantially constant pressure (e.g., within about +/−5%).

As mentioned above, using two different flowrates while the exhaust mechanism is adjusted between different open configurations as explained herein provides numerous advantages over current EFEMs. For example, an overall lower amount of inert gas is used because the inert gas fill operation that uses a high inert gas flowrate occurs for a short, limited period of time while the inert gas recirculation operation that uses a low inert gas flowrate occurs for a longer period of time because it is performed during normal semiconductor processing that involves moving wafers into and through the EFEM. In contrast, some other EFEMs may only flow inert gas into an EFEM at higher flowrates, such as 700 slm or 900 slm. It has been determined by the inventors that the apparatuses and techniques disclosed herein result in a low oxygen level, such as less than or equal to 100 ppm, and a low moisture level, such as less than or equal to 100 ppm.

Figure 6:
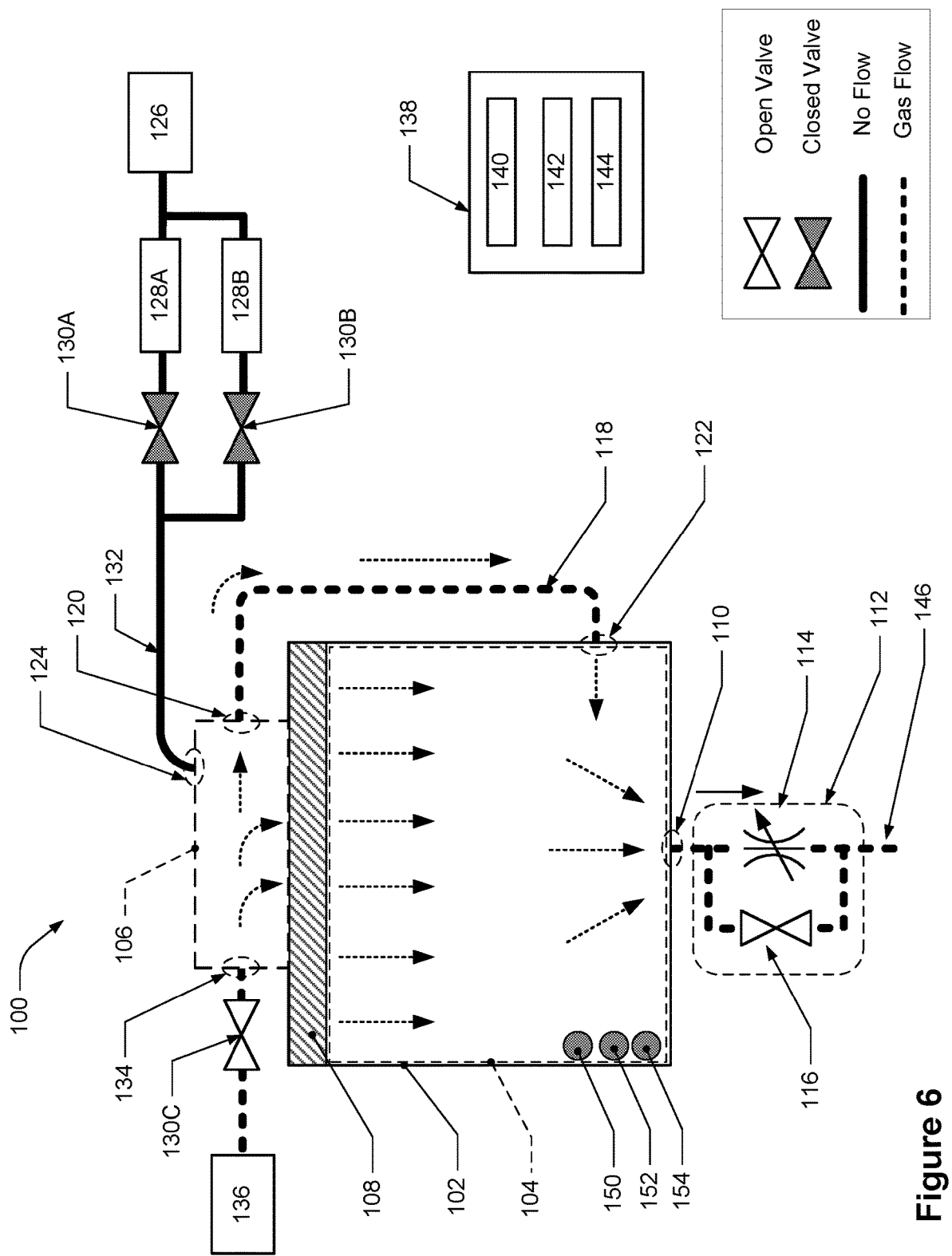
FIG. 6 depicts an example flush-out operation of the EFEM.

In some embodiments, it may be desirable to transition the inert mini-environment of the EFEM to a non-inert environment so that, for instance, it is safe for a user to be located within the mini-environment to perform maintenance or when the tool is no longer preforming processing operations. Inert mini-environments, such as those that have an oxygen level lower than 19.5%, may pose a safety hazard to users or persons that may be located within or near the mini-environment (such as for maintenance, repair, or monitoring purposes). A flush-out operation of the mini-environment may transition it from an inert environment to a non-inert environment, such as an environment that has an oxygen level greater than or equal to 19.5%. FIG. 6 depicts an example flush-out operation of the EFEM. This flush-out may be accomplished by causing the flow of the first gas, e.g., an inert gas such as $N_2$, to stop flowing into the intake plenum 106 and to cause the second gas to flow into the intake plenum 106, through the mini-environment 104, and out of the mini-environment 104 through the EFEM gas outlet 110 and to the exhaust. This second gas may be facility air.

As can be seen in FIG. 6, the flow of the first gas from the first gas supply 126 has been stopped from flowing into the intake plenum 106 (e.g., because valves 130A and 130B are closed) while valve 130C has been opened in order to allow the second gas to flow from the second gas supply 136 into the intake plenum 106, through the mini-environment 104, and out the EFEM gas outlet 110 which is indicated by the dotted directional arrows. The second gas can also be seen flowing from the intake plenum 106 and through the recirculation duct 118 in order to also flush-out the gas in the recirculation duct 118. It should be noted that in some embodiments, depending on pressure within the mini-environment for example, the direction of gas flow through the recirculation duct 118 may be reversed such that gas may be caused to flow through the second end 122, through recirculation duct 118, and out the first end 120 and into the intake plenum 106.

The exhaust mechanism 112 has also been transitioned to a second open configuration which may have a flow conductance greater than the flow conductance of the plurality of semi-open configurations discussed above. This enables gas in the mini-environment 104 to be evacuated rapidly so that the mini-environment 104 can become a safe, non-inert environment quickly. Here in FIG. 6, the exhaust bypass valve 116, which may have a flow conductance greater than or equal to the first open position of the variable position valve 114, has been opened. The variable position valve 114 may also be opened in a flush-out operation to allow full flow conductance through it, which may be considered a 100% open configuration.

The flush-out operation of FIG. 6 may be performed at various times, such as before or during the inert gas fill operation, during the inert gas recirculation operation, or after either such operation. The flush-out operation may also be performed in response to a detection of a leak in the EFEM or a malfunction of one or more components of the EFEM. The apparatus 100 is configured to detect leaks in multiple ways as discussed herein below.

One leak detection technique includes a pressure integrity check. In this technique, a gas is flowed into the mini-environment at a known or pre-set flowrate while the exhaust mechanism is closed in order to attempt to pressurize the mini-environment and during this gas flow into the mini-environment a determination is made as to whether the pressure in the mini-environment reaches or has reached a particular pressure and/or has reached a particular pressure within a particular time period. The particular pressure or the particular pressure and the particular time period may be considered the control measurements that the pressure of mini-environment should reach if there are no leaks, or no unexpected/unknown leaks, in the EFEM. For example, the mini-environment may be isolated by closing the exhaust mechanism and flowing gas into the mini-environment at a known rate (gas inlets not contributing to such gas flow may be closed); if a particular pressure cannot be reached (or a particular pressure cannot be reached within a particular window of time at that flow rate and under the conditions noted above) at that known gas flow rate, then a determination may be made that there is a leak or leaks that have a total outflow rate beyond acceptable maximums. If the mini-environment is unable to be pressurized to the particular pressure in the particular time, then this may be an indication that a leak exists in the EFEM, such as may be caused by a missing or improperly installed panel.

Figure 7:
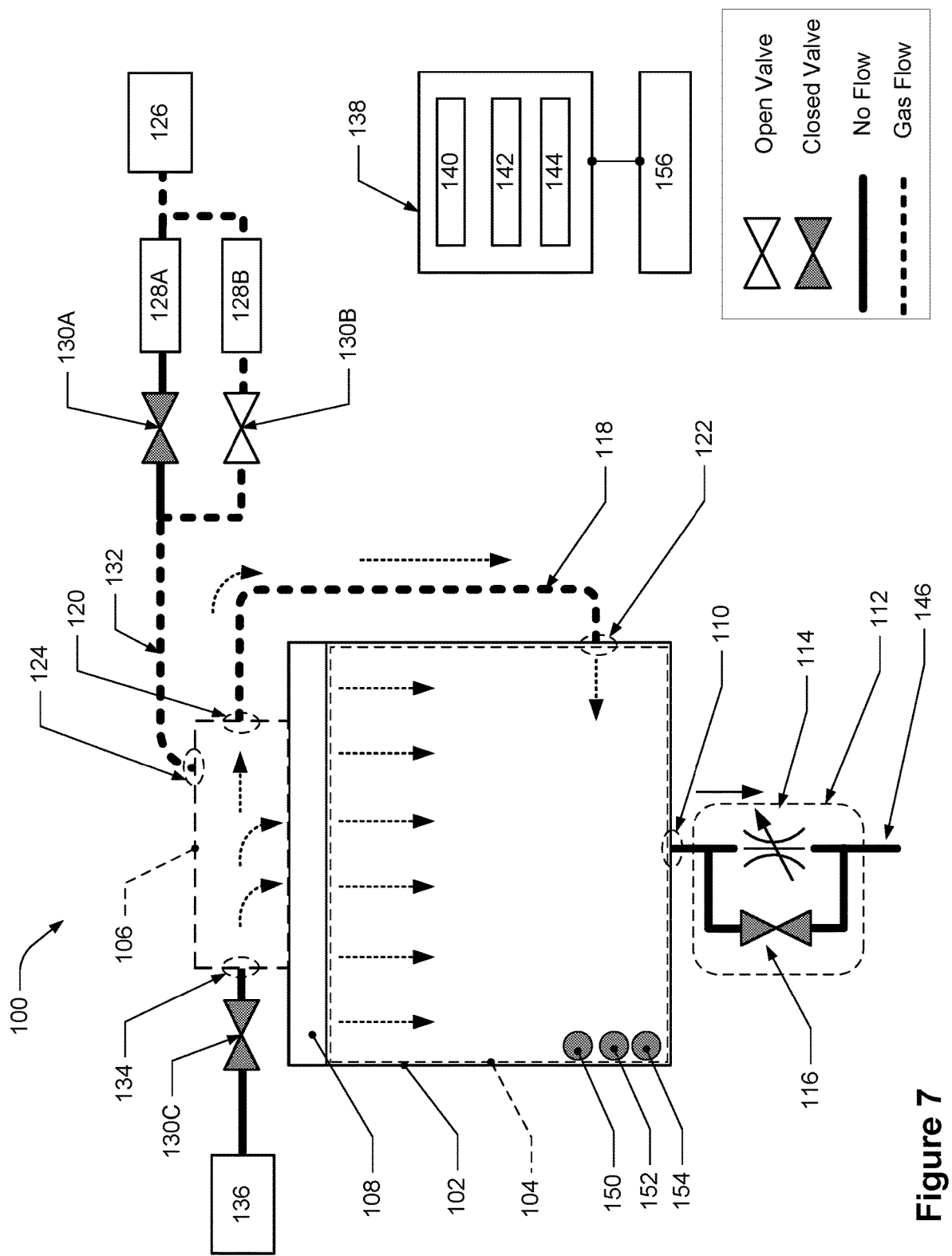
FIG. 7 depicts an example pressure integrity check operation of the EFEM.

FIG. 7 depicts an example pressure integrity check operation of the EFEM. The exhaust mechanism 112 has been transitioned to a closed position so that gas cannot flow out of the EFEM gas outlet 110; similarly flow from the second gas supply 136 is prevented from flowing to the intake plenum 106 by having valve 130C in the closed position. Here, the first gas is flowed from the first gas supply 126 to the intake plenum 106, within the mini-environment 104, and in the recirculation duct 118, as indicated by the dotted arrows. As noted above with respect to FIG. 6, in some embodiments, depending on pressure within the mini-environment for example, the direction of gas flow through the recirculation duct 118 may be reversed such that gas may be caused to flow through the second end 122, through recirculation duct 118, and out the first end 120 and into the intake plenum 106. For example, if the fan unit 108 is active, it will cause gas to flow in a counter-clockwise direction, but if the fan unit 108 is not active, then the gas may flow in a clockwise direction as shown in FIG. 7.

The flowrate of the first gas into the intake plenum 106 during this operation may be any desirable flowrate (e.g., a third flowrate), such as 100 slm. The first gas is flowed at a slow flowrate in order to prevent over usage of the first gas in case a leak is present and to prevent the creation of an unsafe inert environment outside the EFEM 102 if a leak is present. The first sensor 150 detects the pressure of the mini-environment 104 and the controller 138 determines whether a leak is present in the mini-environment 104, or in other parts of the EFEM 102. This determination may be based, at least in part, on the pressure in the mini-environment 104, including whether the pressure in the mini-environment has reached a threshold pressure, or reached the threshold pressure within a particular time period, and based on the known flowrate of the first gas into the intake plenum 106. In some embodiments, the threshold pressure may be between about 0.4 in $H_2O$ and about 1.5 in $H_2O$ and the time period may be about 30 seconds, for example. Although the pressure integrity check operation of FIG. 7 was described using the first gas, any other gas may be used, including the second gas. If a leak is detected during the example pressure integrity check of FIG. 7, the controller 138 may, if there is a possibility of a non-breathable or otherwise potentially harmful atmosphere being within the EFEM, cause a flush-out procedure to occur, like described above. In some embodiments, the apparatus may include a notification mechanism 156 communicatively connected to the controller 138, that may include a graphical user interface, a speaker, or lights, and configured to cause an alert or alarm to be delivered to a user. For example, if a leak is detected, then the controller 138 may cause the notification mechanism 156 to emanate an alarm from the speaker and illuminate or flash a light.

The controller 138 is also configured to determine the presence of a leak during other operations as based, at least in part, upon the pressure of the mini-environment, which may be referred to as a differential pressure tolerance check. For example, during the inert gas fill operation of FIG. 4, the pressure of the mini-environment is expected to reach a particular pressure setpoint, or reach the particular pressure setpoint during a particular time period, and to remain at that particular pressure; and during the inert gas recirculation operation of FIG. 5, the pressure of the mini-environment is expected to remain at, or within suitable margins of, a setpoint pressure. These expected values may be calculated or experimental and may also be based on the known flows into and out of the mini-environment 104, e.g., the known flowrate of the first gas into the intake plenum 106, the known outflows through the exhaust mechanism, and known or expected leaks.

As stated above, the controller 138 determines the pressure of the mini-environment 104 during these operations based on data from the first sensor 150; a determination of the presence of a leak may be based, at least in part, on this detected pressure. For example, a leak may be present if the detected pressure of the mini-environment 104 does not reach the expected pressure within the particular time period or does not remain at the particular pressure. If a leak is determined to be present during either of these operations, then a flush-out operation may be performed and an alarm may be produced by the notification mechanism 156. In some embodiments, like discussed above, the determination of the presence of a leak during these operations may also be based on the flowrate of the first gas into the intake plenum 106, which may be determined based on a flowrate sensor configured to detect the flowrate of gas flowing through the first gas supply inlet 124 or into the intake plenum 106. The tolerance of this pressure-based leak detection technique may be set such that a leak may be determined to exist if the detected pressure is not within a range of pressures from the expected pressure value. For example, a tolerance of +/−5% may be used such that if the pressure of the mini-environment is within +/−5% of the setpoint pressure, then the EFEM may be considered to have an acceptable degree of leakage. The smaller the tolerance is made, the smaller the leak that may be detected.

Another leak detection technique disclosed herein is an active leak monitoring technique. Generally speaking, this technique determines if a leak is present in the EFEM if the flowrate of gas into the EFEM does not match the flowrate of gas out of the EFEM. In some embodiments, the flowrate out of the EFEM is determined by the configuration of the exhaust mechanism 112 due to each configuration of the exhaust mechanism 112 being associated with a known flowrate and the controller 138 being configured to determine the flowrate through the exhaust mechanism 112 based on such configuration. For example, the first open configuration of the throttle valve 114 during the inert gas fill operation of FIG. 4 may have a flowrate of between about 0 lpm and about 500 lpm, for example. Additionally, the flowrate of the inert gas into the intake plenum 106 may also be a known value, as based upon the specified flowrates caused by MFCs 128A and/or 128B. In some such embodiments, the flowrate of gas into the EFEM is a known, not calculated quantity, and the flowrate of gas out of the EFEM is also a known, not measured quantity. Gas flowrates into the mini-environment from other sources or components of the tool may also be included. For example, load ports may be connected to an inert gas supply, such as $N_2$, which may supply the inert gas to the FOUP which may cause the inert gas to flow (from the load port, the FOUP, or both) into the mini-environment when a FOUP is connected to the loadport and the loadport is open. In some embodiments, the loadport gas inflow may be between about 0 lpm and about 160 lmp, for instance. Additionally, gas from the loadlock may also flow into the mini-environment when the loadlock is opened.

Based on these values, the controller may compare the known inflow and outflow rates and determine that a leak is present if these flowrates do not match exactly, or are not within a particular range of each other, such as more than +/−5% from each other. In some other embodiments, the flowrate out of the mini-environment may instead be based on a flowrate detected by a flowmeter configured to detect the flowrate of gas out of the EFEM gas outlet 110 and to the exhaust or based on a pressure of the exhaust mechanism 112 or a pressure of the mini-environment, which can be used to determine the flowrate through the exhaust mechanism 112. For example, a leak equation may be the following: leak=$Q_{in}$-$Q_{out}$; a leak may be present if "leak" is not zero, or not within a particular range of zero, such as about 100 lpm. $Q_{in}$ is the flowrate into the mini-environment, such as the flowrate from the MFC and the inflows from loadports and $Q_{out}$ is all known outflows, such as those of the exhaust mechanism 112. Similar to the above, if a leak is detected in the EFEM during the inert gas fill operation of FIG. 4 or the inert gas recirculation operation of FIG. 5, then a flush-out operation may be performed and an alarm may be produced by the notification mechanism 156.

For example, the controller may be configured to determine the presence of a leak in the EFEM during the inert gas fill operation of FIG. 4 based upon the first flowrate, which is based upon the known flowrate caused by MFC 128A, and the known outflow rate of gas from the mini-environment 104, which is based upon the flowrate of the exhaust mechanism 112 associated with the first open configuration. In another instance, the controller is also configured to determine the presence of a leak in the EFEM during the inert gas recirculation operation of FIG. 5 based upon the second flowrate, which is based upon the known flowrate caused by MFC 128B and other gas flows into the mini-environment 104 such as from loadports or FOUPs, and the known outflow rate of gas from the mini-environment 104, which is based upon the flowrate of the exhaust mechanism 112 associated with the semi-open configurations. If a leak is present during these operations, then the known inflow rate will not match the known outflow rate (either through direct measurement or based on the position of the variable position valve 114) or will not be within a particular range from the known outflow rate, such as within +/−5%.

Other inflow and outflow rates of the EFEM may also be known and caused by gas flowing into or out of the mini-environment 104 when a door of the EFEM is opened, such as a loadlock door. In such embodiments, the active leak detection takes these inflow and outflows into account when determining the presence of a leak.

In some embodiments, additional leak check techniques may be used to determine or characterize the known leaks of an EFEM, which can then be used during the above-described operations of the EFEM, e.g., the inert gas fill operation and the inert gas recirculation operation. In one technique, an operation may be performed similar to the pressure integrity check. Here, a gas is flowed into the mini-environment 104 at a known flowrate in a steady state condition, with all exhaust flows (as well as inlets that are not contributing to the known gas flowrate) closed as described above, then an equilibrium pressure may result due to a leak rate of the EFEM. For instance, if 100 lpm is required to keep the mini-environment 104 at a certain, constant pressure under these conditions, then it may be assumed that the system leaks 100 lpm when at that same pressure even with exhaust mechanism 112 open. This known leak may be stored by the controller 138 on the memory 140 and used in any of the leak determinations discussed herein, including as a known outflow of the EFEM. In another but similar technique, the exhaust mechanism 112 and all other known exhausts are closed (like in the pressure integrity check) and a gas is flowed into the mini-environment 104 at a known flowrate until a pre-defined pressure is reached in the mini-environment 104. Once at this pre-defined pressure, the known gas flow into the mini-environment is stopped and a decay of pressure in the mini-environment over time is measured and a leak rate may be calculated from that rate of decay. This rate of decay may also be stored by the controller 138 and used in any of the other leak determinations discussed herein, again including it as a known outflow rate of the EFEM.

Figure 8:
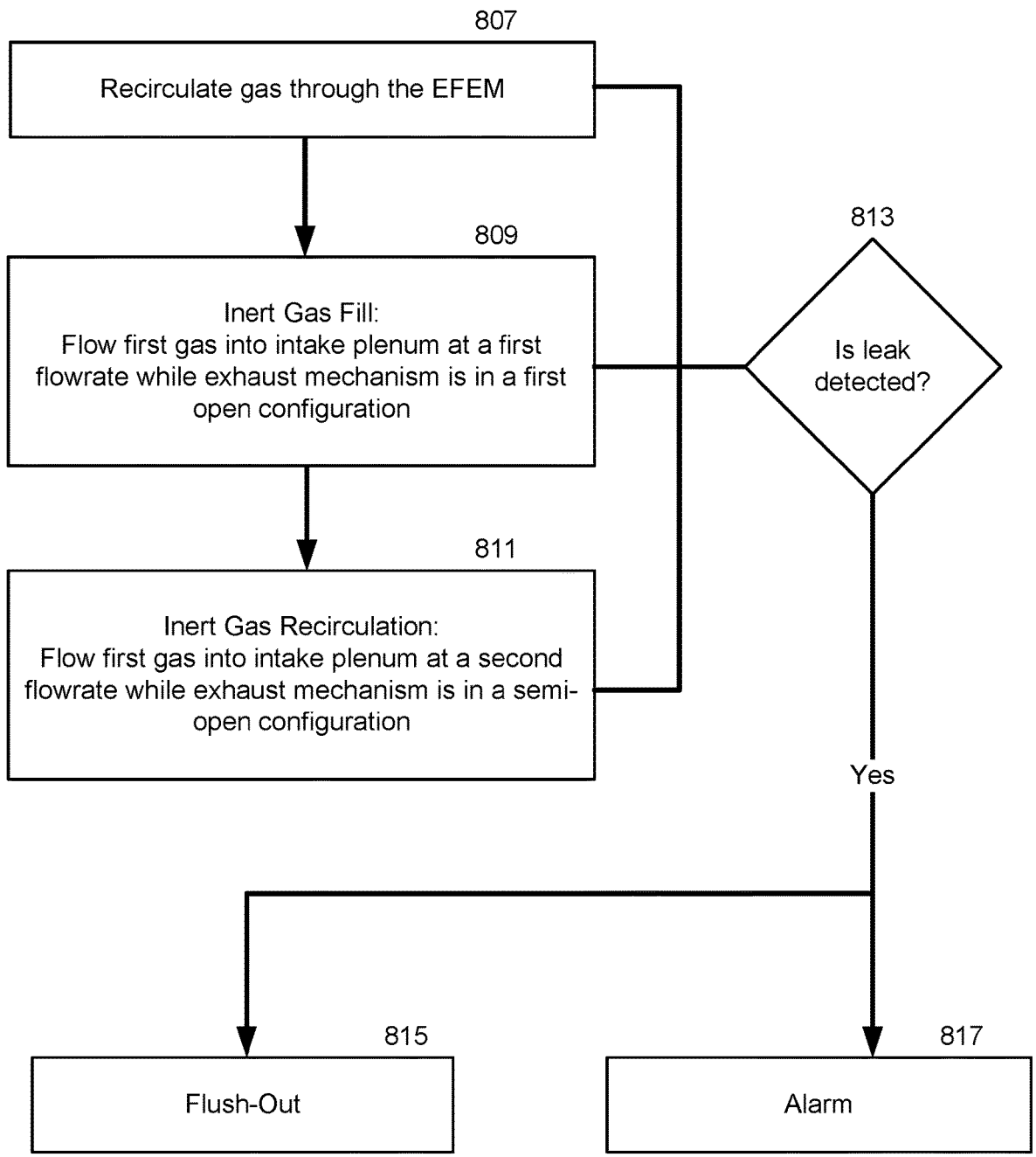
FIG. 8 depicts a flowchart of a second example technique of gas recirculation in the EFEM.

Based on the above, the disclosure includes a second technique illustrated in FIG. 8 which depicts a flowchart of a second example technique of gas recirculation in an EFEM. Here, block 807 represents the gas recirculation described above. Although depicted as occurring before block 809, block 807 may begin before, after, or simultaneously with the inert gas fill operation of block 809. As described above with respect to FIG. 4, the inert gas fill operation block 809 may be performed, after which the gas recirculation operation block 811 may occur like described above with respect to FIG. 5. During blocks 807, 809, and 811, one or more of the leak checks described above may be performed, as indicated by block 813. If a leak is determined to exist, then a flush-out, block 815, or alarm, block 817, may occur, as described above.

The apparatus disclosed herein may also include other safety features. For example, in some embodiments, the controller may be configured to determine whether one or more of the sensors or components has failed, and if such a failure is detected, then to initiate a flush-out, an alarm, or both as described herein (which includes the cessation of the first gas, e.g., the inert gas, into the intake plenum). This may include determining the failure of the fan unit 108, the exhaust mechanism 112, MFCs 128A and 128B, or sensors 150, 152, and 154. Additionally, the apparatus may also have a flow sensor or switch that monitors whether adequate flow is occurring over the second sensor 152 and if the controller determines that there is not such adequate flow, e.g., less than a threshold amount such as 1 lpm, then to also initiate a flush-out, an alarm, or both.

Figure 9:
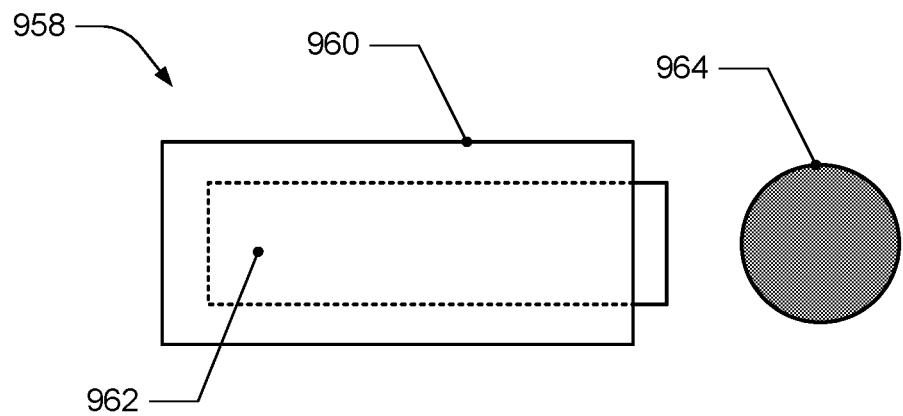
FIGS. 9 and 10 depict the operation of a latch.
Figure 10:
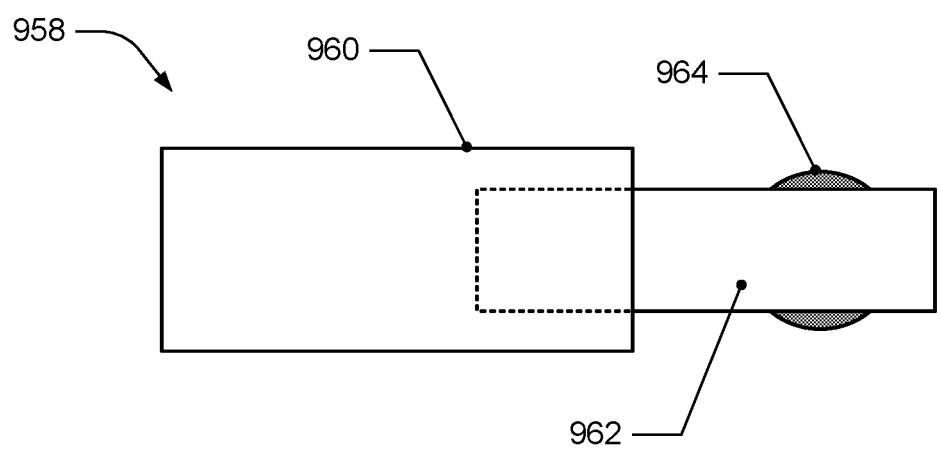

The apparatus may also include a number of safety interlocks that may prevent various doors, hatches, panels, etc. from being opened or removed while the first gas is being flowed through the EFEM. One such interlock mechanism that is a mechanism that may be located on the EFEM and configured to prevent a panel from being removed from the EFEM during inert gas fill and/or inert gas recirculation operations. Many EFEMs include panels that are mounted to the EFEM using bolts or screws and this interlock mechanism, a.k.a., "latch", prevents access to a bolt/screw that is used to mount the panel to the EFEM during such operations. FIGS. 9 and 10 depict the operation of such a latch. In FIG. 9, the latch 958 includes a housing 960 and a piston 962. The latch 958 is configured to cause the piston 962 to be in at least a retracted position and an extended position; in FIG. 9, the piston 962 is in the retracted position. The latch 958 is mounted to the EFEM such that when the piston 962 is in the retracted position, the piston 962 does not cover the mounting hole 964 for the panel when viewed along the center axis of the mounting hole or bolt/screw (and is sufficiently clear of the hole that the bolt or screw may be removed from the hole), like can be seen in FIG. 9. This enables the bolt/screw to be accessed by a user so that it may be removed and the panel may also be removed. When the piston 962 is in the extended position, the piston 962 covers at least a portion of the mounting hole 964 when viewed along the center axis of the mounting hole or bolt/screw, as depicted in FIG. 10. In this configuration, the piston 962 prevents the bolt/screw from being removed which thereby prevents the panel from being removed. The piston may, in some instances, also prevent the insertion of a tool used to tighten or loosen the bolt or screw into the bolt or screw. For example, if the screw is a socket-head cap screw, the piston may prevent the insertion of an Allen wrench or hex driver into the socket of the socket-head cap screw when extended, thereby preventing even the loosening of the screw.

The controller of the apparatus is configured to position the piston 962 into at least the extended and retracted positions, and to cause the piston 962 to be in the extended position during one or more of the operations described herein, such as the gas recirculation operation of FIG. 3, the inert gas fill operation of FIG. 4, and the inert gas recirculation operation of FIG. 2. In some embodiments, the controller is further configured to cause the piston 962 to be in the extended position when it is determined that the oxygen level in the mini-environment is below a particular threshold value, such as below 19.5%, or when it has been determined that the second sensor is not functioning properly.

In some embodiments, the latch 958 may be positioned such that it covers a bolt used to mount a loadport to the EFEM. Many loadports include a loadport panel that forms part of the boundary of the mini-environment and is removable to allow access into the mini-environment from outside the EFEM. When a loadport is mounted to an EFEM, the loadport is connected to the EFEM using, at least in part, a plurality of bolts or screws that pass through the loadport panel and into the EFEM; the loadport is then adjusted and moved and/or rotated in various directions, such as along or about x, y, and z axes so that a docking station on the loadport is level relative to the tool itself. Accordingly, having a safety latch that connects directly to a load port is difficult or not feasible given the amount of unpredictable movement and adjustment made to the loadport after it is bolted to the EFEM. The latch 958 disclosed herein is therefore advantageous for preventing the loadport panel from being removed from the EFEM during the operations disclosed herein because the latch does not directly connect to the loadport or loadport panel, but rather is configured to prevent access to the bolt/screw that passes through the loadport panel in a fixed position relative to the latch and connects the loadport to the EFEM.

In some embodiments, the apparatus herein may include a loadport that is connected to the EFEM by a bolt that passes through a hole of the loadport and through a loadport mounting hole as described above. The latch 958 may be mounted such that when the piston 962 is in the extended position it covers at least a portion of the bolt when viewed along the center axis of the bolt, and when the piston 962 is in the retracted position it does not cover the bolt when viewed along the center axis of the bolt in the extended position.

Additionally, in some embodiments the apparatus includes other safety interlocks that may prevent other access panels or ports from being opened or removed from the EFEM during an inert gas fill operation and/or inert gas recirculation operation, as well as when it is determined that the oxygen level in the mini-environment below a particular threshold, such as 19.5%, or that a component of the EFEM has failed, such as the oxygen sensor or the fan unit.

It is to be understood that the above disclosure, while focusing on a particular example implementation or implementations, is not limited to only the discussed example, but may also apply to similar variants, apparatuses, and techniques as well, and such similar variants, apparatuses, and techniques are also considered to be within the scope of this disclosure.

What is claimed is:

1. An apparatus comprising:
   an equipment front end module ("EFEM") having
      a mini-environment,
      an intake plenum fluidically connected to the mini-environment,
      an EFEM gas outlet at the bottom of the EFEM and fluidically connected to the mini-environment, and
      a fan unit configured to cause gas flowed from the intake plenum to move through the mini-environment;
   an exhaust mechanism fluidically connected to the EFEM gas outlet and configured to be transitionable between at least a plurality of first open configurations and a plurality of second open configurations that have flow conductances less than the flow conductances of the plurality of first open configurations;
   a recirculation duct that has a first end fluidically connected to the intake plenum and a second end fluidically connected to the mini-environment;
   a first gas supply inlet fluidically connected to the intake plenum and configured to fluidically connect with a first gas supply;
   a second gas supply inlet fluidically connected to the intake plenum and configured to fluidically connect with a second gas supply; and
   a controller configured to:
   (a) cause gas recirculation within the EFEM by causing gas to flow from the mini-environment, through the recirculation duct and the intake plenum, and back into the mini-environment,
   (b) cause, during (a), a first gas to flow from the first gas supply and into the intake plenum at a first flowrate while the exhaust mechanism is in one or more of the first open configurations,
   (c) cause, during (a) and after (b), the first gas to flow from the first gas supply and into the intake plenum at a second flowrate less than the first flowrate while the exhaust mechanism is in one or more of the second open configurations, and
   (d) cause a second gas to flow from the second gas supply and into the intake plenum.

2. The apparatus of claim 1, wherein the exhaust mechanism includes a throttle valve.

3. The apparatus of claim 1, further comprising a pressure sensor configured to measure a pressure in the mini-environment, wherein:
   the controller is further configured in (b) to adjust the configuration of the exhaust mechanism between the one or more first open configurations, based, at least in part, on the pressure of the mini-environment, and
   the controller is further configured in (c) to adjust the configuration of the exhaust mechanism between the one or more second open configurations based, at least in part, on the pressure of the mini-environment.

4. The apparatus of claim 3, wherein:
   the controller is further configured to: (e) determine whether the pressure in the mini-environment is at, above, or below a first threshold pressure,
   the controller is further configured in (b) to adjust the configuration of the exhaust mechanism based, at least in part, on the determination in (e), and
   the controller is further configured in (c) to adjust the configuration of the exhaust mechanism based, at least in part, on the determination in (e).

5. The apparatus of claim 3, wherein the controller is further configured to:

determine, during (b) and/or (c), whether a leak is present in the EFEM based, at least in part, on the pressure in the mini-environment and a flowrate of the first gas into the intake plenum, and cause, based on the determination that a leak is present in the EFEM, the exhaust mechanism to transition to a third open configuration that has a flow conductance greater than or equal to a maximum flow conductance of the plurality of second open configurations, the flow of first gas flow from the first gas supply to the intake plenum to stop, and the second gas to flow from the second gas supply to the intake plenum.

6. The apparatus of claim 5, wherein:
the exhaust mechanism includes a throttle valve and an exhaust bypass valve fluidically connected in parallel with the throttle valve, and
causing the exhaust mechanism to move to a third open configuration includes causing the exhaust bypass valve to transition to an open configuration.

7. The apparatus of claim 5, further comprising a flowrate sensor configured to detect a flowrate of gas flowing through the first gas supply inlet.

8. The apparatus of claim 3, wherein the controller is further configured to:
(f) cause the exhaust mechanism to move to a closed configuration,
(g) cause, after (f), gas to flow through the intake plenum and into the mini-environment at a third flowrate, and
(h) determine, during or after (g), whether a leak is present in the EFEM based, at least in part, on the pressure in the mini-environment and on the third flowrate.

9. The apparatus of claim 8, wherein the controller is further configured to cause, based on a determination of the presence of a leak in the EFEM in (h), the exhaust mechanism to transition to a third open configuration that has a flow conductance greater than flow conductance of the plurality of second open configurations, and the second gas to flow from the second gas supply to the intake plenum.

10. The apparatus of claim 1, wherein the controller is further configured to:
determine an outflow rate of gas from the mini-environment through the exhaust mechanism,
determine, during (b), whether a leak is present in the EFEM based, at least in part, on the first flowrate and the outflow rate of gas from the mini-environment,
determine, during (c), whether a leak is present in the EFEM based, at least in part, on the first flowrate and an outflow rate of gas from the mini-environment,
cause, based on a determination that a leak is present in the EFEM, one or more of:
an alarm to occur, and
the exhaust mechanism to transition to a third open configuration that has a flow conductance greater than a maximum flow conductance of the plurality of second open configurations, the flow of the first gas from the first gas supply to the intake plenum to stop, and the second gas to flow from the second gas supply to the intake plenum.

11. The apparatus of claim 10, wherein the determination of the outflow rate of gas from the mini-environment is based on one or more of: the configuration of the exhaust mechanism, a pressure of the exhaust mechanism, and a flowmeter.

12. The apparatus of claim 1, further comprising:
a first mass flow controller fluidically connected to the first gas supply inlet and configured to fluidically connect with the first gas supply, a second mass flow controller fluidically connected to the first gas supply inlet and configured to fluidically connect with the first gas supply, wherein:
the controller is further configured in (b) to cause the first mass flow controller to flow the first gas into the intake plenum at the first flowrate, and
the controller is further configured in (c) to cause the second mass flow controller to flow the first gas into the intake plenum at the second flowrate.

13. The apparatus of claim 1, further comprising:
an oxygen sensor configured to measure an oxygen level in the mini-environment, and
a moisture sensor configured to measure a moisture level in the mini-environment, wherein:
the controller is further configured in (c) to adjust the flowrate of the first gas based, at least in part, on the oxygen level and the moisture level of the mini-environment.

14. The apparatus of claim 13, further comprising a pressure sensor configured to measure a pressure in the mini-environment, wherein:
the controller is further configured in (b) to adjust the configuration of the exhaust mechanism between the one or more first open configurations, based, at least in part, on one or more of: the pressure of the mini-environment, the oxygen level, and the moisture level of the mini-environment, and
the controller is further configured in (c) to adjust the configuration of the exhaust mechanism between the one or more second open configurations based, at least in part, on one or more of: the pressure of the mini-environment, the oxygen level, and the moisture level of the mini-environment.

15. The apparatus of claim 1, further comprising:
a loadport mounting hole located on the EFEM, and
a latch that has a housing and a piston, and is configured to position the piston in a retracted position and an extended position, wherein:
the latch is mounted to the EFEM such that when the piston is in the extended position the piston covers at least a portion of the loadport mounting hole when viewed along the center axis of the load port mounting hole, and when the piston is in the retracted position the piston does not cover the loadport mounting hole when viewed along the center axis of the load port mounting hole, and
wherein the controller is further configured to cause the piston to be in the extended position during (a), (b), (c), and (d).

16. The apparatus of claim 15, further comprising an oxygen sensor configured to measure an oxygen level in the mini-environment, wherein:
the controller is further configured to cause, based on a determination that the oxygen level in the mini-environment is below a second threshold value, the piston to be in the extended position.

17. The apparatus of claim 15, further comprising a loadport connected to the EFEM, wherein:
a bolt extends through a hole of the loadport and through the loadport mounting hole to thereby connect the loadport to the EFEM,
when the piston is in the extended position the piston covers at least a portion of the bolt when viewed along the center axis of the bolt, and
when the piston is in the retracted position the piston does not cover the bolt when viewed along the center axis of the bolt.

18. The apparatus of claim 1, wherein the controller is further configured to:

cause, during (b) or (c), the exhaust mechanism to transition to a third open configuration that has a flow conductance greater than flow conductance of the plurality of second open configurations, the flow of the first gas from the first gas supply to the intake plenum to stop, and the second gas to flow from the second gas supply to the intake plenum.

\* \* \* \* \*